United States Patent
Hu et al.

(10) Patent No.: US 6,658,040 B1
(45) Date of Patent: Dec. 2, 2003

(54) HIGH SPEED VCSEL

(75) Inventors: Syn-Yem Hu, San Jose, CA (US); I-Hsing Tan, Cupertino, CA (US); Tchang-Hun Oh, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 218 days.

(21) Appl. No.: 09/627,878

(22) Filed: Jul. 28, 2000

(51) Int. Cl.[7] .............................................. H01S 5/183
(52) U.S. Cl. ...................................................... 372/96
(58) Field of Search ........................................... 372/96

(56) References Cited

U.S. PATENT DOCUMENTS

| | | | |
|---|---|---|---|
| 5,262,360 A | 11/1993 | Holonyak, Jr. et al. | 437/237 |
| 5,493,577 A | 2/1996 | Choquette et al. | 372/46 |
| 5,896,408 A | 4/1999 | Corzine et al. | 372/46 |
| 6,014,395 A * | 1/2000 | Jewell | 372/45 |
| 6,208,681 B1 * | 3/2001 | Thornton | 372/96 |

OTHER PUBLICATIONS

E.M. Strzelecka et al., "VCSEL based modules for optical interconnects," Jan. 1999, Part of SPIE Conference on Vertical–Cavity Surface–Emitting Lasers III, San Jose, California, SPIE vol. 3627, pp. 2–13.

* cited by examiner

Primary Examiner—James Davie

(57) ABSTRACT

A vertical cavity surface emitting laser (VCSEL) has a top mirror structure with a surface, a light generation region, and a bottom mirror structure for reflecting light toward said top mirror structure. The VCSEL has a semiconductor portion with a surface that is disposed substantially planar with respect to the surface of the top mirror structure. At least one aperture-defining layer having an isolatable material is disposed in at least one of the bottom mirror structure and the top mirror structure. The aperture-defining layer has a conducting region, an insulating region having an aperture-defining surface for defining the conducting region, and a single trench adjacent to the insulating region for use in generating the insulating region. The trench having a continuous geometry for reducing the parasitic capacitance of the VCSEL.

22 Claims, 18 Drawing Sheets

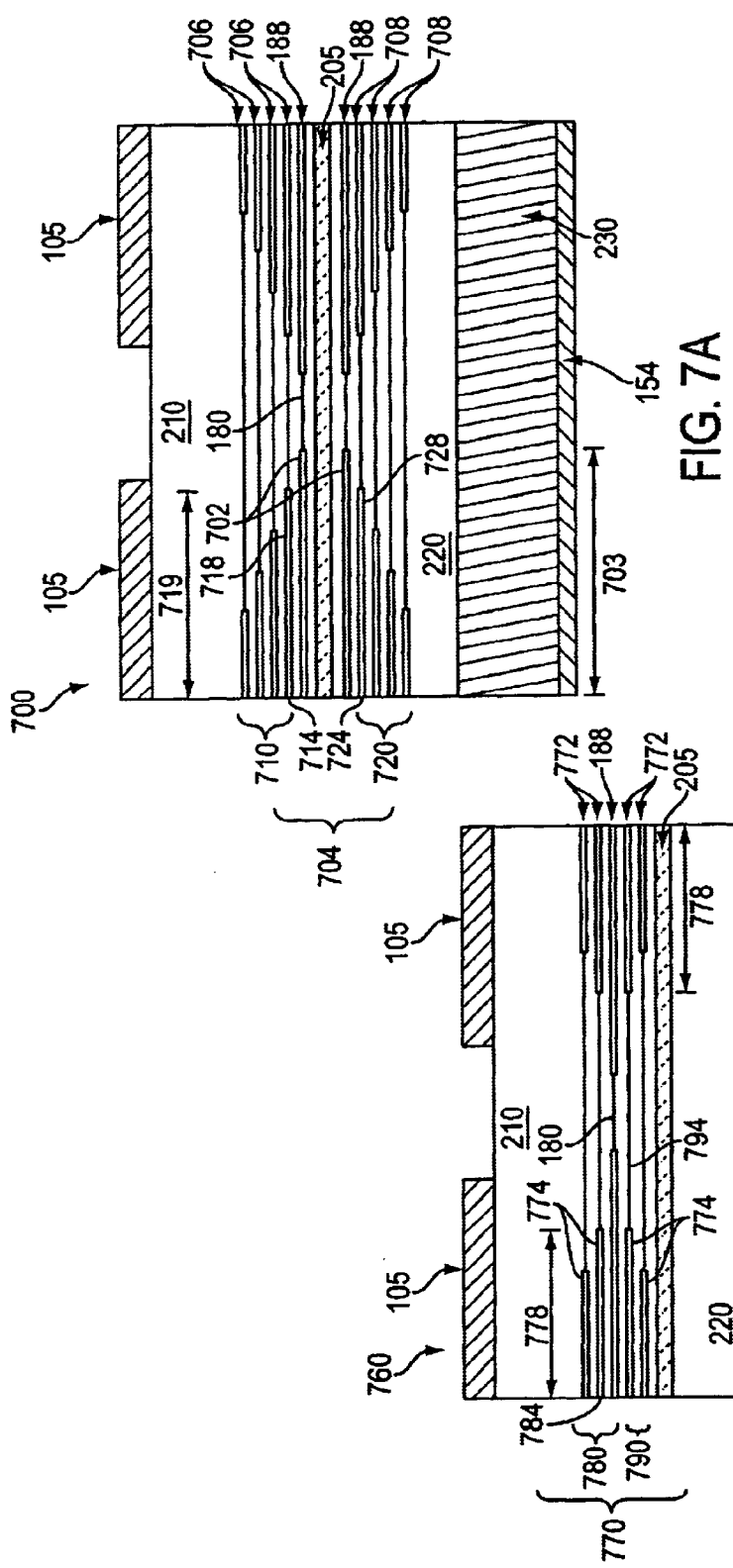

HIGH SPEED VCSEL

FIELD OF THE INVENTION

The present invention relates generally to semiconductor-based lasers, and more particularly, to Vertical Cavity Surface-Emitting Lasers (VCSELs).

BACKGROUND OF THE INVENTION

Optical data communication systems provide an important way for transferring large amounts of data at high speeds. An important component in these optical data communication systems is an optical transceiver. On the transmission side, the optical transceiver functions to translate data in the form of electrical signals (e.g., digital information in the form of 1s and 0s) into optical signals that are suitable for transmission via a transmission medium (e.g., fiber optic cable). On the reception side, the optical transceiver converts the received optical signals back into data in the form of electrical signals. An important component in the optical transceiver design is the transmitter for transmitting optical data. Typically, the transmitter is implemented with a light emitting diode (LED) for megabit applications and a semiconductor laser diode for gigabit applications.

Semiconductor laser diodes were originally fabricated in a manner that provides an optical cavity formed parallel to the surface of the semiconductor wafer. In this structure, light is emitted from the edge of the wafer. Unfortunately, this structure does not lend itself to low cost "mass" manufacturing or to the cost-effective fabrication of two-dimensional arrays of laser diodes.

A new class of laser diodes is fabricated such that the optical cavity is formed perpendicular to the surface of the semiconductor wafer, and the light is emitted perpendicular to the surface. These laser diodes are commonly referred to as Vertical Cavity Surface-Emitting Lasers (VCSELs). A typical VCSEL consists of an active region which emits light and surrounding mirrors constructed from alternating layers of materials having different indices of refraction. These lasers are better suited for the fabrication of arrays and are widely utilized in optical data communication systems.

The lateral dimension of VCSELs is defined by confining the current flowing vertically in the VCSEL to a small area. Early designs utilized either etched mesa or ion-implanted regions to contain the current flow. However, these approaches are not satisfactory for small size devices. For the etched mesa approach, there is the problem of light scattering. For the implanted approach, there is the problem of optical confinement in the implanted structure.

In response to these shortcomings, a method for restricting the current flow and also for providing optical confinement was developed. This method utilizes an oxide aperture created by a wet oxidation process to convert one or more high aluminum content layers within the VCSEL structure to some form of aluminum oxide.

There are two main VCSEL structures that each has a different approach to form this current-restricting oxide aperture by oxidizing a single or multiple aluminum-containing layers in mirror stacks by using different surface topologies. A first type of prior art VCSELs uses a so-called mesa-type or pillar-type structure having a relatively tall etched "pillar" mesa, with a relatively small oxidation area, which enables it for high speed operations. One such mesa-type VCSEL is described in U.S. Pat. No. 5,493,577, entitled "Efficient Semiconductor Light-Emitting Device and Method," by Choquette et al.

One problem with the mesa-type oxide-confined VCSELs is the nonplanar geometry encountered in fabricating such devices. In general, the bottom of the mesa has to be etched deep enough to get access to the oxide aperture forming layers, which is usually several microns below the original epitaxial surface (typically 4–7 $\mu$m). To provide access to the layer being oxidized, the device is first etched to form a mesa structure with the edges of the various mirror layers exposed. The exposed edges are then subjected to a wet oxidation process. The oxidation process proceeds along the layer from the outer edge of an etched mesa toward the center of the mesa. The process is stopped prior to converting the entire layer, thereby leaving a small unoxidized area in the center of the mesa, which defines the laser aperture. The mesa-structure is generally more difficult to fabricate than the planar approach described hereinbelow.

A second problem is that these mesa-type structures requires a thick insulative filling (e.g., polyimide) in order to bridge the top metal contact and the metal bond pad, which can sit on the polyimide or on a semi-insulating substrate. Since the insulative layer has a thermal coefficient that is quite different from the thermal coefficient of the semiconductor layer, the polyimide layer tends to apply severe stress to the semiconductor during the both the fabrication process of and operation of the VCSEL. For example, when the device is subject to thermal or electrical stress, the differences in the thermal coefficient of the polyimide and the semiconductor layer can potentially cause the device to physically or structurally fail. Consequently, it has been a challenge from a manufacturing point of view to fabricate highly reliable and high speed oxide-confined VCSEL based upon the mesa-type structure.

The second type of prior art VCSELs features a planar topology. One such planar-type VCSEL is described in U.S. Pat. No. 5,896,408, entitled "Near planar native-oxide VCSEL Devices and Arrays Using Converging Oxide Ringlets," by Corzine et al. This approach has the advantage of a relatively simple wafer fabrication process and suitable for low-cost mass production. This planar structure has proven to be able to provide sufficient performance for current 1 Gb/s to 2 Gb/s data transmission rates. However, due to the fact that, in order to connect the oxide fronts originated from adjacent oxidation holes (or other geometry) to form a closed perisphere oxide aperture, the oxidation process is typically long and thus the oxidation area is large which may limit its performance at higher data transmission rates.

Another planar-type VCSEL is described in a paper entitled, "VCSEL Based Modules for Optical Interconnects," by Strzelecka, E. M., Morgan, R. A., Liu, Y., Walterson, B., Skogen, J., Kalweit, E., Bounak, S., Chanhvongsak, H., Marta, T., Skogman, D., Nohava, J., Gieske, J., Lehman, J., Hibbs-Brenner, M. K, Proceedings of the SPIE—The International Society for Optical Engineering, Vol. 3627, pages 2–13, 1999. This approach uses multiple trenches or segments. Unfortunately, this approach does not adequately address parasitic capacitance issues. Consequently, this approach may suffer in performance especially at high data rates.

High Speed Design Considerations

As the bit rates of data transmission increase to greater than two gigabits per second and beyond, new design considerations and mechanisms are required to achieve these types of data transmission speeds. Unfortunately, the prior art approaches do not identify or address these design considerations for high-speed VCSEL design. The inventors of the present invention have identified the parasitic capacitance of the VCSEL as an important design consideration for those devices operating at greater than two gigabits per second and especially for devices designed to operate at greater than ten gigabits per second.

Unfortunately, the prior art approaches do not provide any mechanism to adequately address and reduce the parasitic capacitance of VCSEL structures. Consequently, the prior art structures may suffer from high parasitic capacitance that can limit the VCSEL's speed performance at the high-speed transmission rates given above.

Based on the foregoing, there remains a need for a high speed vertical cavity surface emitting laser that overcomes reduces the parasitic capacitance of the device and at the same time overcomes the disadvantages set forth previously.

SUMMARY OF THE INVENTION

In one embodiment, the present invention is a VCSEL with a nearly planar top surface on which the top electrode is disposed. A VCSEL according to the present invention includes a top electrode that is preferably a ring contact, a top mirror having a top surface, a light generation region, and a bottom mirror for reflecting light toward the top mirror. At least one of the mirrors includes a plurality of planar electrically conducting layers having different indices of refraction. At least one aperture-defining layer having an isolatable material is provided in at least one of the bottom mirror structure and the top mirror structure. The isolatable material can be oxidized, etched, or oxidized and then selectively etched, to form an insulating region that has an aperture-defining surface for defining at least a portion of an aperture.

A single trench that has a continuous geometry for reducing the parasitic capacitance is etched down from the top surface of the VCSEL through or beyond those layers having the isolatable material. At least one of these isolatable layers is used for an aperture-defining purpose. The trench can be utilized to expose the isolatable layer to an isolating agent (thereby converting the isolatable material to an insulating region), thereby oxidizing and/or etching the isolatable layer. The partial isolation of the layer converts the layer to one having a conducting region surrounded by an electrically insulating region, the conducting region being positioned under the top electrode.

Preferably, the aperture-defining layer has a conducting region, an insulating region having an aperture-defining surface for defining the conducting region, and a single trench adjacent to the insulating region for use in generating the insulating region. The trench has a continuous geometry for reducing the parasitic capacitance of the VCSEL.

In an alternative embodiment of the present invention, a ring shape conductive contact is replaced with a transparent disk-shape conductive contact. The transparent disk-shape conductive contact features a larger contact area, as compared to the first embodiment, in order to reduce the contact resistance. Furthermore, this embodiment allows an optimization of oxidization depth, thereby reducing the parasitic capacitance.

According to another aspect of the present invention, a VCSEL structure with or without a near planar top surface can be fabricated to include a plurality of isolatable layers where each layer has an insulating region (e.g., an oxide ring). These multiple insulating regions provide a mechanism for reducing the product of the total parasitic capacitance and the differential resistance at the VCSEL's bias point.

According to yet another aspect of the present invention, a VCSEL structure with or without a near planar top surface can be fabricated to include a capacitance-reducing implantation region that can serve as another mechanism for reducing the product of the total parasitic capacitance and the differential resistance at the VCSEL's bias point.

According to another aspect of the present invention, a VCSEL structure with or without a near planar top surface can be fabricated to include an insulating layer (e.g., a low k dielectric layer) disposed on at least a portion of the near planar top surface of the device. A conducting material for electrically coupling a bond pad to an emitting area is then deposited on at least a portion of the insulating layer. The insulating layer serves as a mechanism for reducing the parasitic capacitance due to the contact between the semiconductor surface and a conductive contact.

BRIEF DESCRIPTION OF THE DRAWINGS

The present invention is illustrated by way of example, and not by way of limitation, in the figures of the accompanying drawings and in which like reference numerals refer to similar elements.

FIG. 7A illustrates a cross sectional view of a portion of a vertical cavity surface emitting laser having a first arrangement of a plurality of capacitance-reducing layers with insulating regions for reducing parasitic oxide capacitance according to one embodiment of the present invention. FIG. 7B illustrates a cross sectional view of a portion of a vertical cavity surface emitting laser having a second arrangement of a plurality of capacitance-reducing layers with insulating regions for reducing parasitic oxide capacitance according to an alternative embodiment of the present invention.

DETAILED DESCRIPTION OF THE PREFERRED EMBODIMENT

A VCSEL structure having a trench with a geometry for reducing the parasitic capacitance of the VCSEL and a method for fabricating such a structure are described. Furthermore, additional mechanisms for reducing the parasitic capacitance of the VCSEL to enable high-speed performance are described. In the following description, for the purposes of explanation, numerous specific details are set forth in order to provide a thorough understanding of the present invention. It will be apparent, however, to one skilled in the art that the present invention may be practiced without these specific details. In other instances, well-known processing steps, equipment, and materials are not described in order to avoid unnecessarily obscuring the present invention.

A first embodiment of the present invention that features a VCSEL structure with a trench and a non-transparent conductive contact is described in connection with FIGS. 1–3. A second embodiment of the present invention that features a VCSEL structure with a trench and a transparent conductive contact is described in connection with FIGS. 4–6. A first mechanism for reducing the parasitic capacitance associated with the aperture-defining isolatable layers of the VCSEL structure is described with reference to FIGS. 7A–7B. A second mechanism for reducing the parasitic capacitance associated with the aperture-defining isolatable layers of the VCSEL structure is described with reference to FIG. 8. A mechanism for reducing the parasitic bond pad capacitance of the VCSEL structure is described with reference to FIGS. 9–11. It is noted that the semiconductor laser structures in which the novel aspects of the present invention can be implemented are described hereinafter can be either an n-up structure grown on a p-type substrate, a p-up structure grown on an n-type substrate, or either a p-up structure or n-up structure grown on a semi-insulating substrate.

VCSEL Having a Non-Transparent Top Electrode

Figure 1:
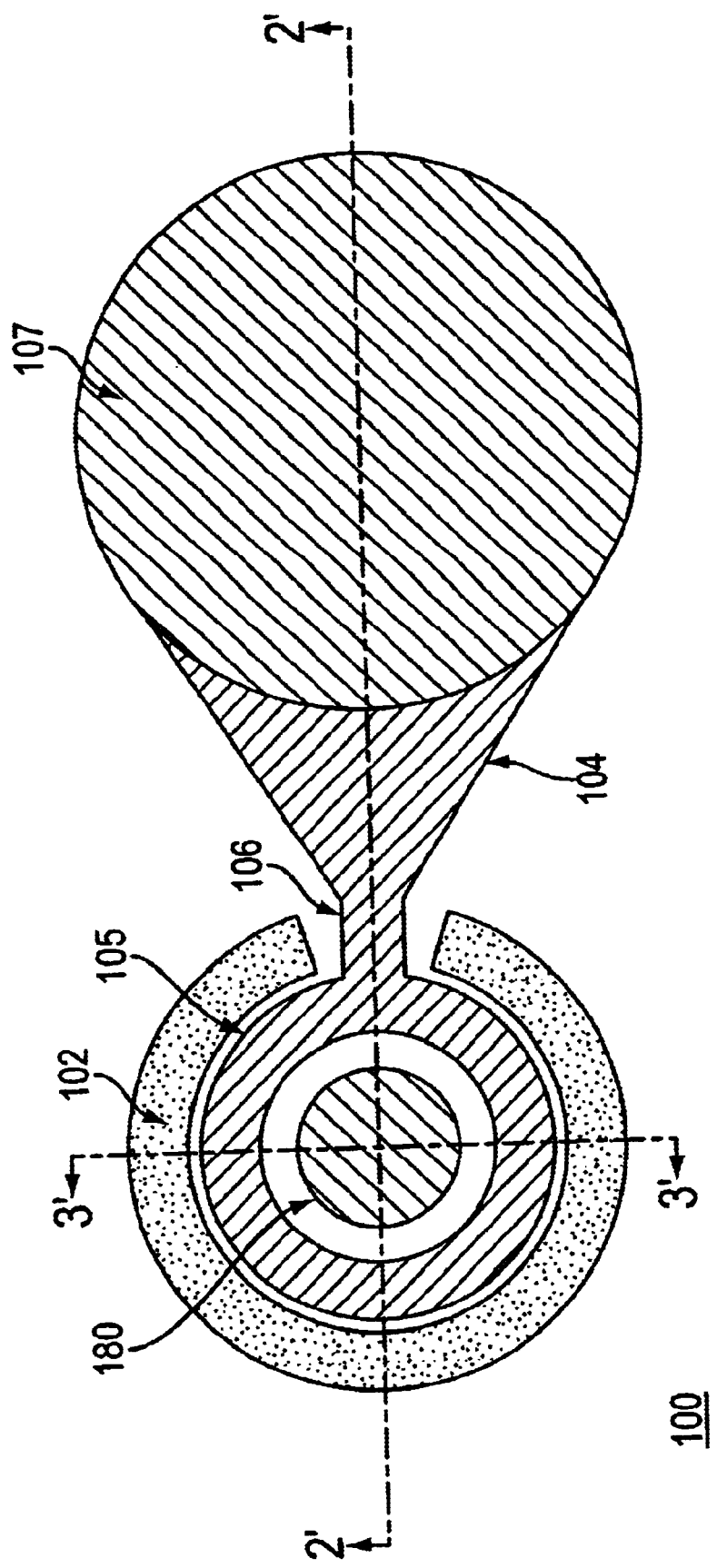
FIG. 1 is a top plan view of a vertical cavity surface emitting laser in accordance with one embodiment of the present invention.
Figure 2:
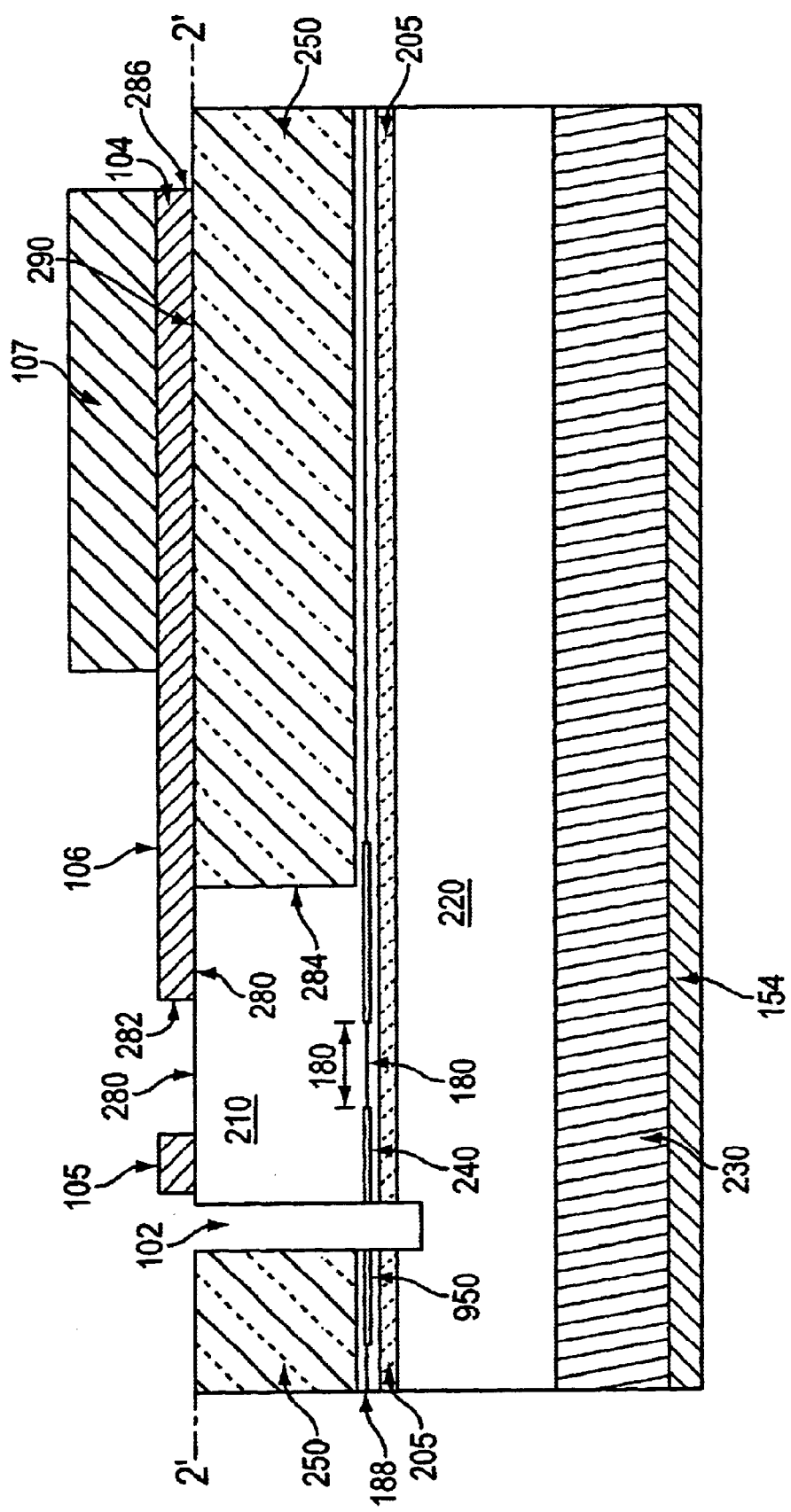
FIG. 2 is sectional view of the vertical cavity surface emitting laser of FIG. 1 through the line 2'—2'.
Figure 3:
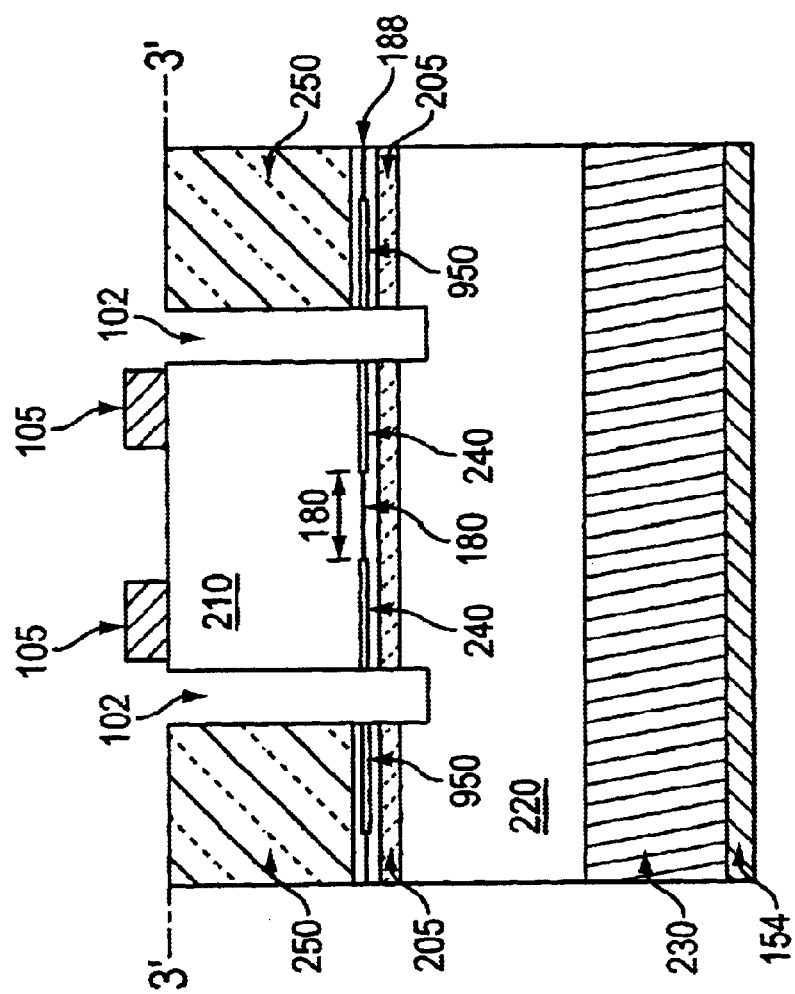
FIG. 3 is sectional view of the vertical cavity surface emitting laser of FIG. 1 through the line 3'—3'.

FIGS. 1–3 illustrate different views of a high-speed planar-type VCSEL 100 that is configured in accordance with a first embodiment of the present invention.

Referring to FIG. 2, the VCSEL structure 100 includes a trench 102, a top mirror structure 210, a bottom mirror structure 220, a first implantation region or area 250, an isolatable layer 188 (e.g., an oxidizable layer or etchable layer), an aperture 180 formed in the layer 188, a first electrode 105 (e.g., a ring contact), and a second electrode 154. The isolatable layer 188 can be any layer that can be (1) selectively oxidized, (2) selectively etched, (3) selectively oxidized and then selectively etched, or a combination thereof.

In this embodiment, the surface 280 of the top mirror structure 210 is preferably substantially planar with respect to a surface 290 of a semiconductor portion 250, which in this case is implanted, but may be compensated in other ways that are known by those of ordinary skill in the art. The surface 280 is defined as the common interface between the top electrode 104 and the top mirror structure 210 that extends laterally from an edge 282 of the top electrode 104 to the boundary 284 between the top mirror structure 210 and the implantation 250. The surface 290 is defined as the common interface between the top electrode 104 and the implantation 250 that extends laterally from the boundary 284 between the top mirror structure 210 and the implantation 250 to a right-most edge 286 of the top electrode 104.

The phrase "substantially planar" shall mean that the surface 280 is disposed less than one micron with respect to the surface 290. Preferably, the surface 280 is disposed less than 3000 Angstroms with respect to the surface 290.

Similarly, in the embodiment illustrated in FIGS. 4–6, which is described in greater detail hereinafter, the surface 280 is preferably substantially planar with respect to surface 290. The surface 290 is defined in the same manner as in the first embodiment. However, surface 280A is defined as the common interface between the top electrode 104 and the top mirror structure 210 that extends from a left-most edge 288 of the top electrode 104 to the boundary 284 between the top mirror structure 210 and the implantation 250.

The VCSEL 100 has a layered structure in which the light is emitted in a vertical direction that is perpendicular to the planes of the layers. In a first embodiment, the VCSEL 100 includes a semiconductor substrate 230, a plurality of epitaxially-grown compound semiconductor layers forming a first mirror stack 220 above the substrate 230, a second mirror stack 210 above the first mirror stack 220, a light generation region 205 (also referred to herein as "active region") between the mirror stacks 210, 220, and one or more isolatable layers 188 which are partially isolated to form an aperture 180 with the insulating region 240. These isolatable layers 188 can disposed in either of the mirror stacks 210 and 220, or both of the mirror stacks 210 and 220.

For example, isolatable layers 188 can be oxidizable layers which are partially oxidized to form an oxide-confined aperture 180 with insulating region 240 (e.g., an oxide region). These oxidizable layers 188 can disposed in either or both of the mirror stacks 210 and 220, near to the light generation region 205.

The embodiments described herein below employ a layer 188 that is preferably an oxidizable layer 188. However, it is noted that layer 188 can be any isolatable layer having an isolatable material. The term isolatable layer means any layer formed of any material in which an insulating region 240 can be formed. For example, the isolatable material can be an oxidizable material that can be oxidized, an etchable material that can be etched, or a material that can be partially oxidized and etched. It also noted that the insulating region can be processed by introducing an agent to oxidize an oxidizable material to create an oxide insulating region as described previously. Alternatively, when an etchable material is utilized, the insulating region can be fabricated by introducing an agent to etch away the etchable material to form an insulating region that is devoid of material (e.g., an air gap). Such an insulating region is also referred to herein as a void region. In yet another alternative embodiment, after such a void region is created, an insulative material (e.g., polyimide or spin-on glass) can be utilized to re-fill or back-fill the void region.

The VCSEL structure may be viewed as a p-i-n diode having an upper mirror region 210, the light generation region 205, and a lower mirror region 220. These regions are constructed on a substrate 230, which in this example is an n-type semiconductor. Electrical power is applied between electrodes 105 and 154. The various layers are constructed by epitaxial growth or other deposition methods. Since the construction of these layers is well known to those skilled in the laser arts, it will not be described in detail here.

The light generation region 205 is typically constructed from one or more quantum wells of InGaAs, GaAs, AlGaAs, InGaAsN, GaAsSb, also (Al) GaInP, GaInAsP or InAlGaAs. The light generation region 205 may be separated from mirror regions 210 and 220 by spacers (not shown). The choice of material depends on the desired wavelength of the light emitted by the VCSEL or other desired VCSEL properties. In addition, devices based on bulk active regions are known to the art. The active layer 205 may be viewed as a light generation layer which generates light due to stimulated emission via the recombination of electrons and holes injected by forward biasing the p-i-n diode.

The mirror regions 210, 220 are constructed from alternating layers with different indices of refraction. The thickness of each layer is typically chosen to be one quarter of the wavelength of the light within each layer. The stacks form a structure known as a distributed Bragg reflector (DBR) mirror structure. To obtain the desired reflectivity, multiple pairs of layers are required. In this example, the layers in the upper mirror region 210 are doped to be p-type semiconductors, those in the lower mirror region 220 are doped to be n-type semiconductors in this example, and the bottom electrode 154 is preferably an n-ohmic contact. However, n-i-p diode structures may also be constructed by growing the structures on a p-substrate. Also, both the p-i-n and n-i-p diode structures may be constructed on a semi-insulating substrate.

The current flow between electrodes 105 and 154 is confined to region 180 by an insulating region 240 produced by converting portions of the oxidizable layer 188 to an insulator as described below. The region 180 is referred to as a current-confining aperture.

In the VCSEL shown in FIGS. 1–3, the light is emitted from the top surface of the VCSEL. However, designs in which the light is emitted through a transparent substrate are also known. It will be apparent to those skilled in the art from the following discussion that the teachings of the present invention may also be applied to such transparent substrate designs.

As noted above, the insulating region 240 can be created by converting a portion of one or more of the mirror layers (e.g., oxidizable layer 188) into an insulating region (e.g., an oxide region). The conversion process is based on the observation that water vapor supplied in a carrier gas at an elevated temperature, typically 400 degrees Celsius or higher, oxidizes the oxidizable layer 188 to form some form of electrically-insulating oxide. For example, a high-Al-content AlGaAs layer may be converted to the form of an aluminum oxide. The selective lateral oxidation of one of the layers is based on the observation that the rate at which steam oxidizes the $Al_xGa_{1-x}As$ depends critically on the value of x. Since this oxidation process is well known to those skilled in the art, it will not be discussed further here. The reader is referred to U.S. Pat. No. 5,262,360, entitled "AlGaAs Native Oxide" by Holonyak, Jr. et al., for a more detailed discussion of an exemplary process.

The oxidizable layer 188 is preferably an aluminum containing material that can include, but is not limited to, aluminum gallium arsenide (AlGaAs), aluminum indium arsenide (AlInAs), and aluminum gallium antimony (AlGaSb).

Trench 102

Figure 12A:
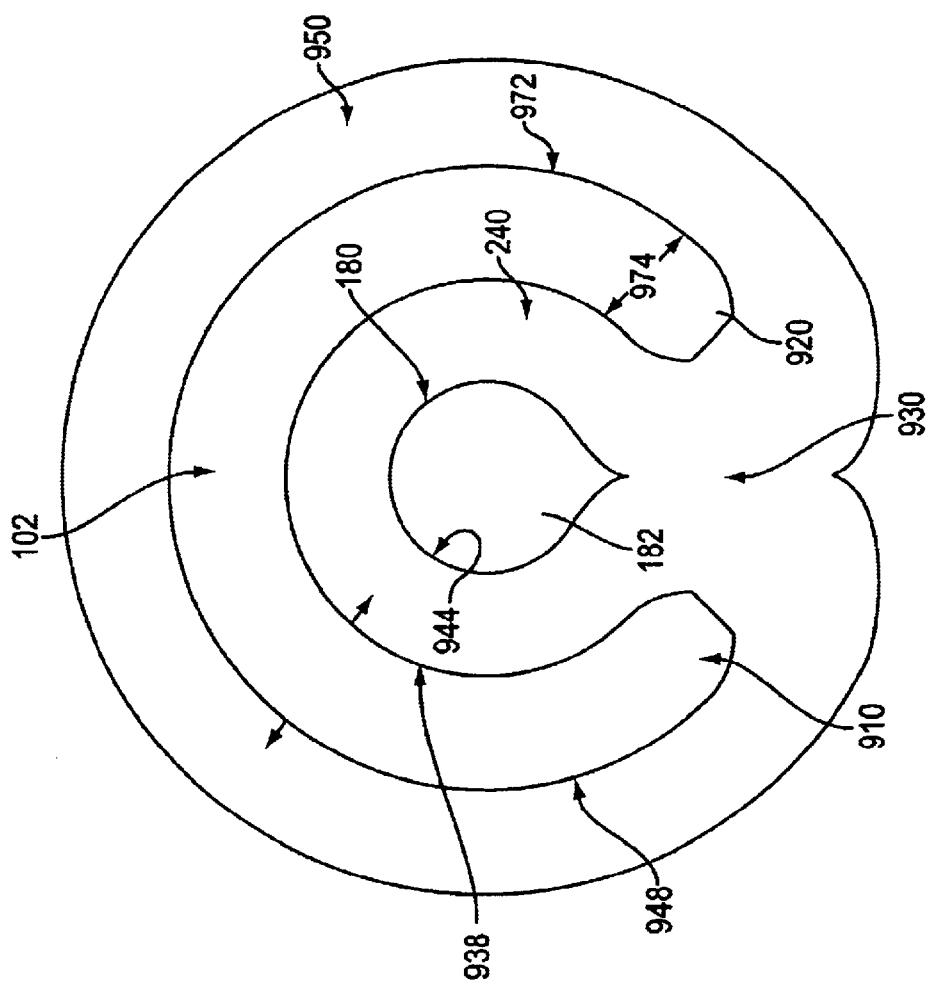
FIG. 12A illustrates an aperture having a perimeter that is entirely defined by an aperture-defining surface of an insulating region in accordance with the one embodiment of the present invention.

Referring to FIG. 12A, the term "trench" is defined as a cut-out or cavity having a first dimension 974 that can be a width and a contour 972 having a length (e.g., perimeter). The trench 102 can have any profile, geometry, or shape provided that the profile or geometry provides an open end for receiving a conductive contact (e.g., a metal contact) for electrically coupling an emitting area to a bond pad 107. The width 974 of the trench 102 can be varied to suit a particular application. Preferably, the width 974 of trench 102 is greater than or equal to about 2 $\mu$m. However, it is noted that the width 974 can be decreased to be less than 2 microns as long as the width 974 is sufficient to prevent substantial capacitive coupling between the first region 240 and the second region 950 that are described herein below.

The trench 102 is a continuous trench that preferably has a contour 972 for producing a final oxide-confined aperture 180 whose perimeter or boundary is substantially formed by an aperture-defining surface 944 of the first insulating region 240 (referred to herein as a "C-trench"). The term "substantially" shall mean greater than about 50% of the perimeter or boundary is formed by the aperture-defining surface 944 of the first insulating region 240 (e.g., the oxide region). Preferably, the aperture-defining surface 944 of the insulating region (e.g., the oxide region) forms more than 75% of the perimeter or boundary of the aperture 180.

It is noted that the percentage of the perimeter or boundary of the conducting region (i.e., aperture 180) defined by the aperture-defining surface 944 of the first insulating region 240 depends on factors, such as the device geometry, desired process robustness, and the desired device performance and may be tailored to suit a particular application.

FIG. 12A illustrates an insulator-confined aperture 180 having a conducting region that is completely bounded by the aperture-defining surface 944 of the first insulating region 240 (i.e., the entire boundary of the aperture or conducting region 180 is formed by the aperture-defining surface 944 of the first insulating region 240).

Figure 12B:
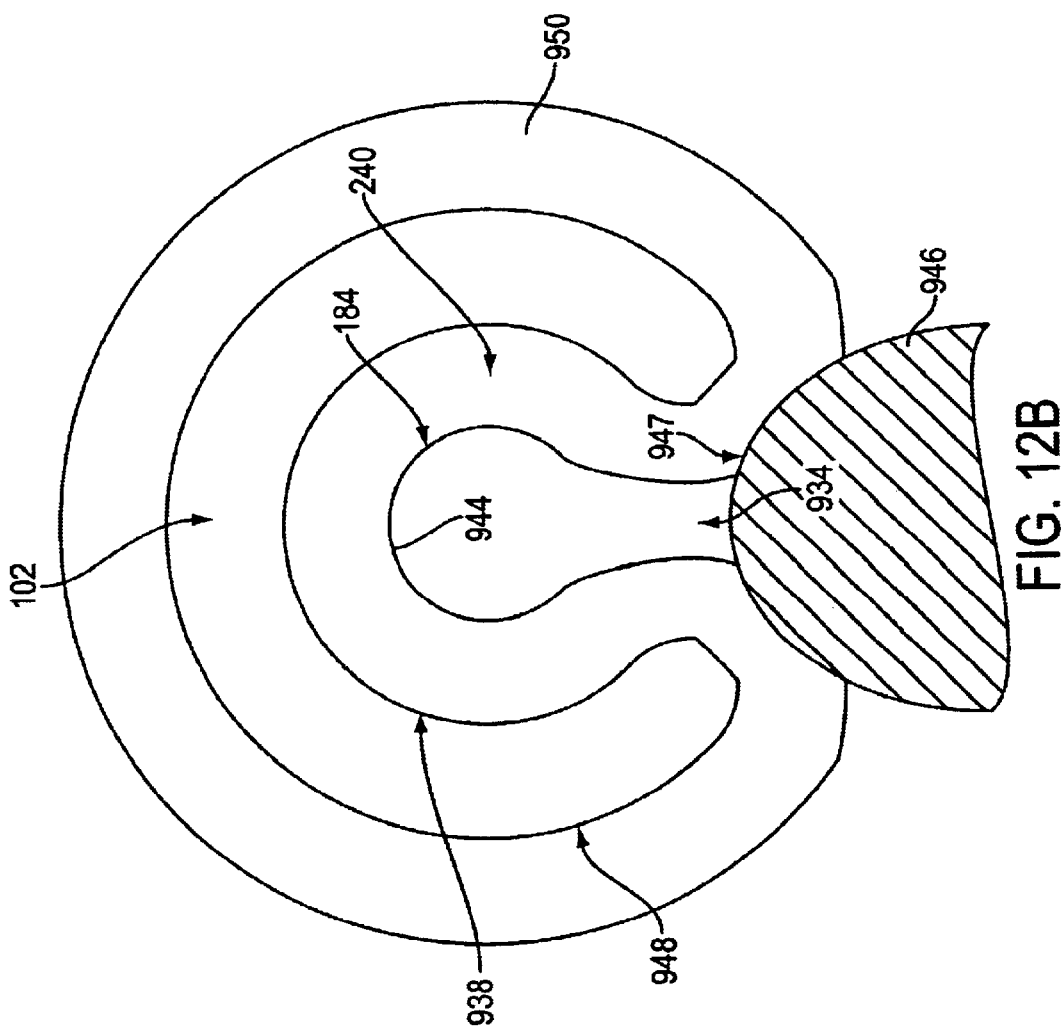
FIG. 12B illustrates an aperture having a perimeter that is defined partially by an aperture-defining surface of an insulating region and partially defined by an aperture-defining surface of an implantation region in accordance with an alternative embodiment of the present invention.
Figure 13:
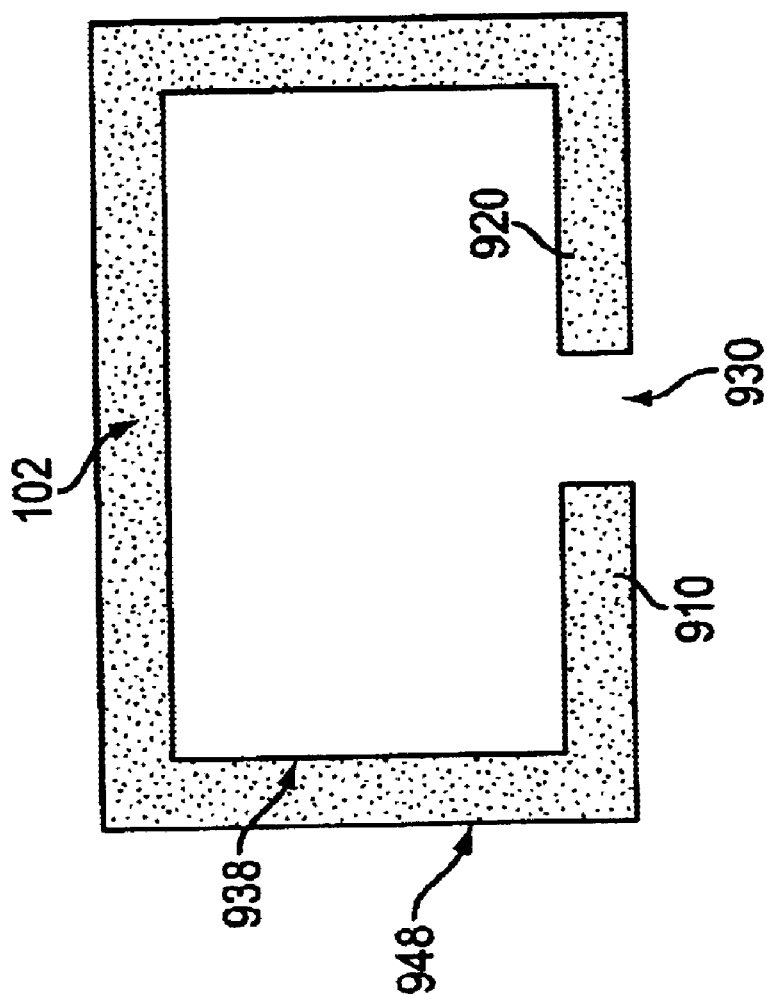
FIG. 13 illustrates a trench having a generally square shape geometry.
Figure 14:
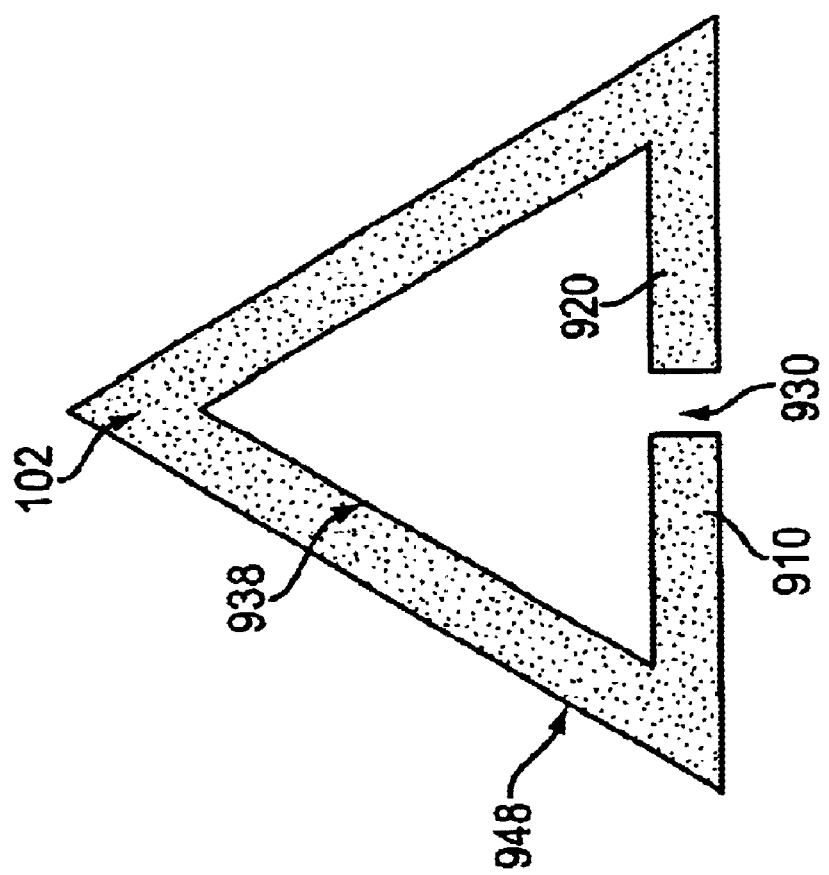
FIG. 14 illustrates a trench having a generally triangle shape geometry.

FIG. 12B illustrates an insulator-confined aperture 184 having an area substantially bounded by the aperture-defining surface 944 of the insulating region 240 and partially bounded by an aperture-defining surface 947 of an implantation region 946. In this embodiment, since the aperture 184 is not completely bounded by the aperture-defining surface 944 of the first insulating region 240 (e.g., an oxide region), an implantation region 946 is utilized to form a portion of the boundary or perimeter of the aperture. The implantation region 946 includes an aperture-defining surface 947 that preferably overlaps with the first insulating region 240 to reduce the leakage current through an open area 934 (e.g., a channel).

In comparison to a multiple trench or hole approach, this single continuous trench design of the present invention has a lower parasitic oxide capacitance. For example, a parasitic oxide capacitance value of about 0.75 pF has been measured from structures with a single continuous trench of the present invention as compared with a parasitic oxide capacitance value of about 1.80 pF that has been measured from prior art structures that have a trench divided into multiple segments.

Referring again to FIG. 12A, the trench 102 can include a first end 910 and a second end 920 for defining an opening 930 for allowing a connection portion 106 to extend therethrough. A connection portion 106 of the top electrode 104 couples the bond pad contacting portion to the ring contact 105 or disk contact 405.

One aspect of the present invention is the provision of a single trench 102 that has a continuous geometry for reducing the parasitic capacitance of the VCSEL. The geometry of the trench 102 reduces the parasitic capacitance by effectively isolating a first region 240 and a second region 950 in the isolatable layer 188 as further described below.

In prior art approaches, such as that described in U.S. Pat. No. 5,896,408, the arrangement of the holes is tailored to generate a generally circular aperture that can couple to fiber optic cables with greater ease. However, the prior art approaches fail to consider or utilize the geometry of the holes to reduce the parasitic capacitance of the VCSEL in order to improve the speed and performance of the VCSEL.

The present invention not only identifies parasitic capacitance (e.g., parasitic oxide capacitance) as an important factor in the design of high speed VCSELS, but also provides mechanisms for reducing the capacitance for greater speed operation. One aspect of the present invention is the use of the geometry of the trench 102 to reduce the parasitic capacitance of the VCSEL.

A single continuous trench ("C-trench") 102 is preferred since such a trench geometry results in better isolation between the first region 240 and the second region 950, and thus results in a lower parasitic capacitance when compared to other non-continuous geometries. In other words, the "C-trench" provides better isolation of the insulating material inside and outside the C-trench, thereby leading to increased speed performance.

The trench 102 has a first surface 938 and a first region 240 that extends radially inward from the first surface 938. The first region 240 is also referred to hereinafter as an "inner region." The first region 240 defines an aperture 180 that is a current confining aperture. Current flows through the generally circular area 182 (also referred to herein as "conducting region") defined by the aperture 180. The trench 102 has a second surface 948 and a second region 950 that extends radially outward from the second surface 948. The second region 950 is also referred to hereinafter as an "outer region." Preferably, the trench 102 substantially surrounds the current-confining aperture 180 in the isolatable layer.

Another aspect of the present invention is the use of a trench geometry that provides a nearly circular current-confining aperture. As shown in FIG. 12A, a generally circular current confining aperture can be realized by utilizing a single continuous trench with a generally circular geometry. A nearly circular current-confining aperture produces a generally circular laser beam, which advantageously increases the ease of optical alignment and light coupling to optical fibers.

However, it is to be appreciated, that geometry of the trench can be varied to suit the requirements of a particular application provided that the geometry defines an opening for a conductive contact to electrically couple the emitting area to the bond pad and that the geometry reduces the parasitic capacitance of the VCSEL. A trench with a generally circular-shape geometry, a trench with a generally rectangular-shape geometry, and a trench having a generally triangle-shape geometry (when viewed in the direction of the light emission) are illustrated in FIGS. 12A, 12B, 13, and 14, respectively. It is noted that other geometries can be utilized. For example, these other geometries can include, but are not limited to, a generally square-shape geometry, a generally elliptical-shape geometry from the VCSEL.

Figure 15:
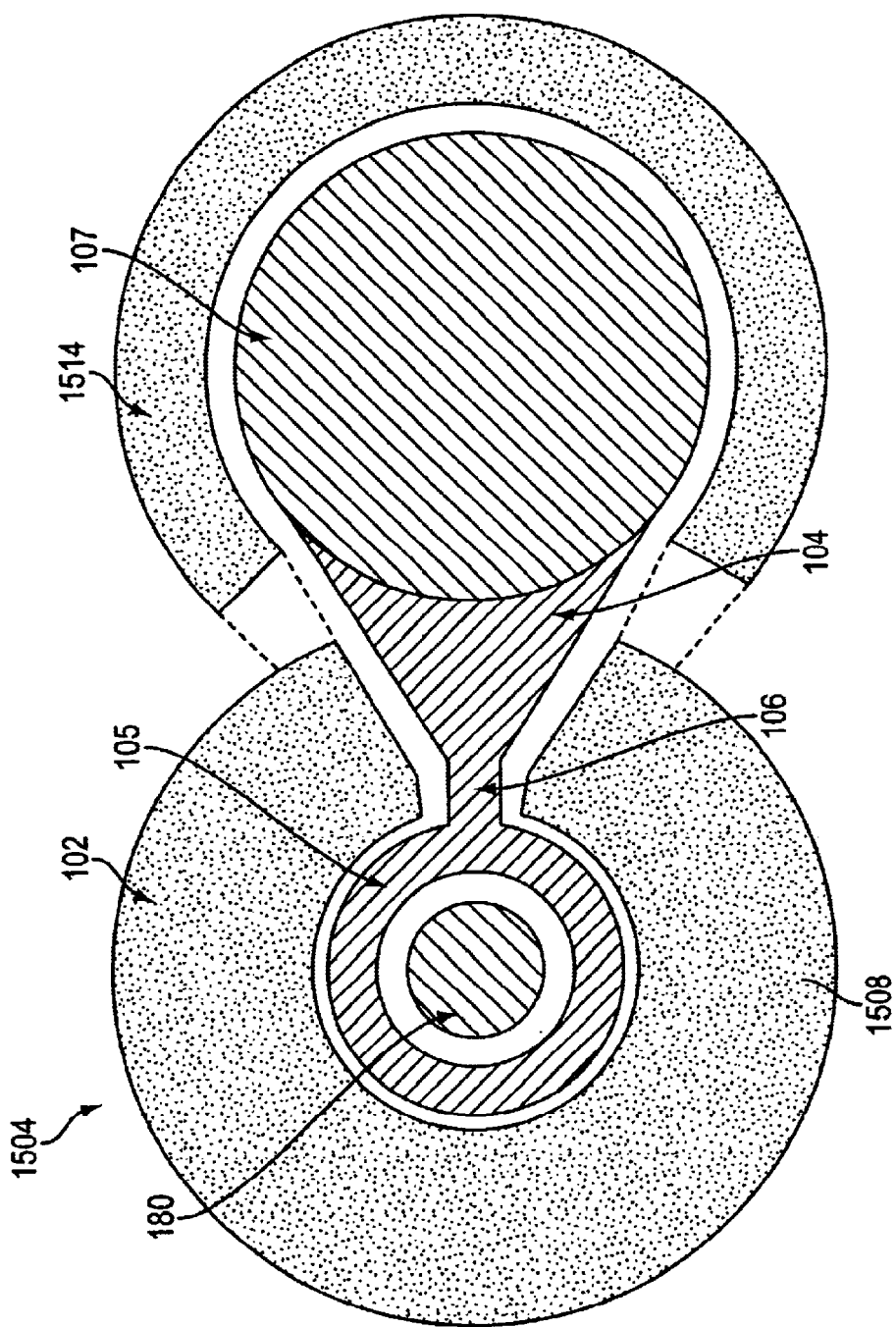
FIG. 15 illustrates a trench having a geometry that includes a portion for surrounding the bond pad area.

The trench geometry 1504 can also have a portion 1514 for surrounding the bond pad 107 as shown in FIG. 15. The trench 102 has a continuous portion 1508 that substantially surrounds the aperture 180 and a bond pad surrounding portion 1514 for surrounding the bond pad 107. The bond pad surrounding portion 1514 can be continuous or discontinuous with respect to the trench 102. In this embodiment, the trench is modified to surround the entire VCSEL device instead of only the aperture.

It is noted that the first region 240 in the isolatable layer 188 for defining the aperture can be formed by oxidization in part, etching in part, oxidization in whole, or etching in whole, or a combination thereof.

Processing the Trench 102

It is important that the trench 102 is etched to a depth to provide access to layer 188 (e.g., a layer of oxidizable material). The trench 102 should extend from the top surface of the VCSEL structure 100 at least to layer 188. It is noted that the trench depth can vary to suit a particular application. For example, if the isolatable layer 188 is disposed above the active layer 205, the trench can extend only through a portion of the first DBR mirror 210 to the isolatable layer 188. Similarly, if the isolatable layer 188 is disposed under the active layer 205, the trench can extend through the first DBR mirror 210 and the active layer 205 to reach the isolatable layer 188. Preferably, the etch depth is minimized, provided the isolatable layer 188 is exposed to the air, to improve thermal conductivity of the device.

When the isolatable layer 188 is comprised of an oxidizable material, and the structure 100 is exposed to steam, the steam enters the trench 102 and a moving oxidation front is established. The front proceeds radially from the trench 102 as shown by the arrows in FIG. 12. The process is allowed to continue until the fronts merge under the electrode 105 leaving an unoxidized aperture 180 under the electrode 105.

Figure 4:
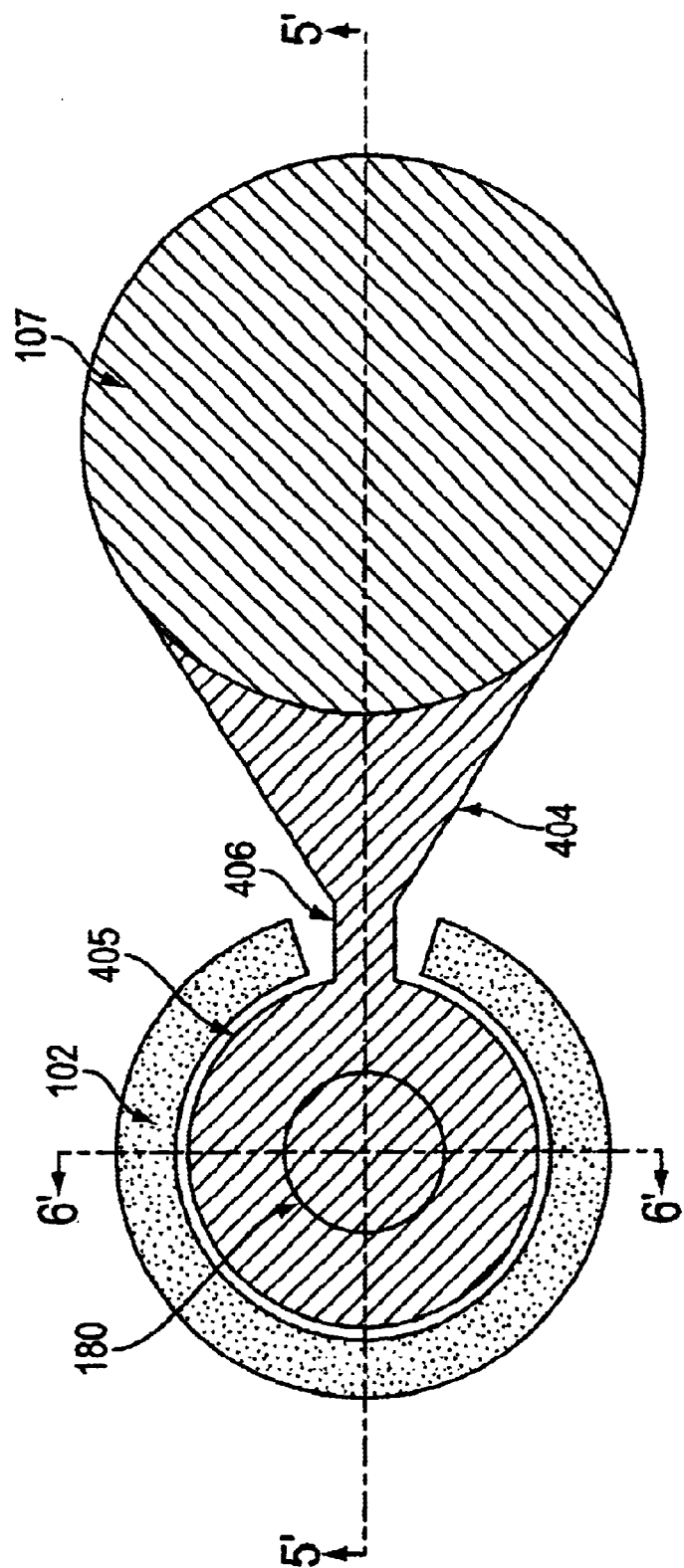
FIG. 4 is a top plan view of a vertical cavity surface emitting laser in accordance with an alternative embodiment of the present invention that uses a transparent contact.

The trench 102 is described as having a generally circular geometry (see FIGS. 1 and 4). However, it will be apparent to those skilled in the art from the above description that the trench 102 may have other profiles with different geometric shapes. By altering the shape and geometry of the trench 102, the shape of the laser aperture 180 may be controlled. For example, the shape and geometry of the trench 102 can be set by conventional photolithographic techniques. The etching of the trench 102 can be performed by wet etching with a mixture of chemicals or alternatively by dry etching (e.g., reactive ion etching) for better accuracy and more vertical side walls.

Top Electrode 104

A top electrode 104 is provided for electrically coupling the top mirror stack 210 to a bond pad 107. The top electrode 104 includes a mirror stack contact portion 105 for coupling to the mirror stack, a bond pad contacting portion for coupling to the bond pad 107, and a connection portion 106 for connecting the mirror stack contact portion 105 and the bond pad contacting portion. The connection portion 106 extends through the opening 930 defined by the first end 910 and the second end 920 of the trench 102.

In this embodiment, the semiconductor portion 105 is a metal ring that surrounds the emitting aperture 180. The current spreads out from the metal ring within the semiconductor stack and eventually is confined by the aperture 180.

VCSEL Having a Transparent Top Electrode Layer 404

Figure 5:
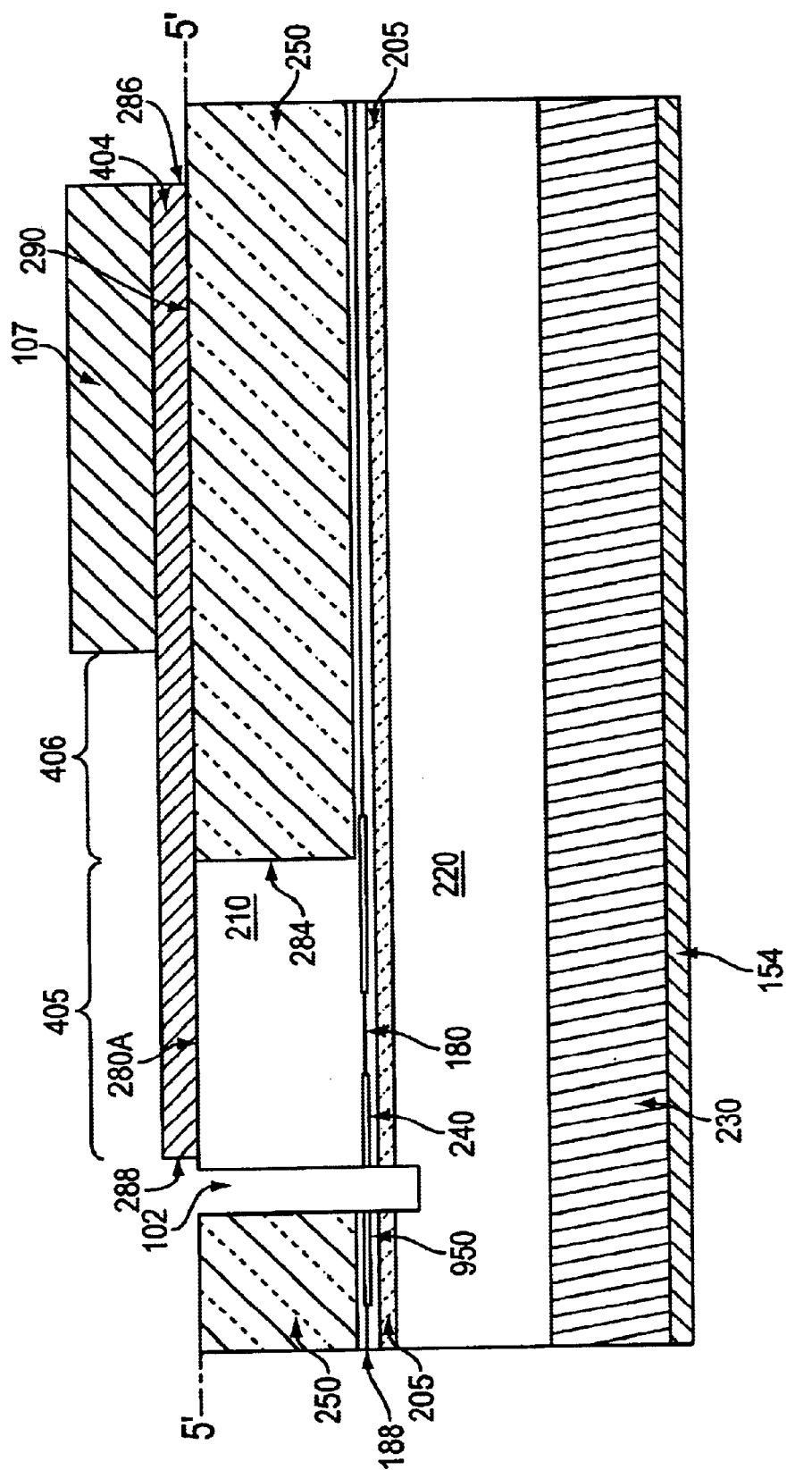
FIG. 5 is sectional view of the vertical cavity surface emitting laser of FIG. 4 through the line 5'—5'.
Figure 6:
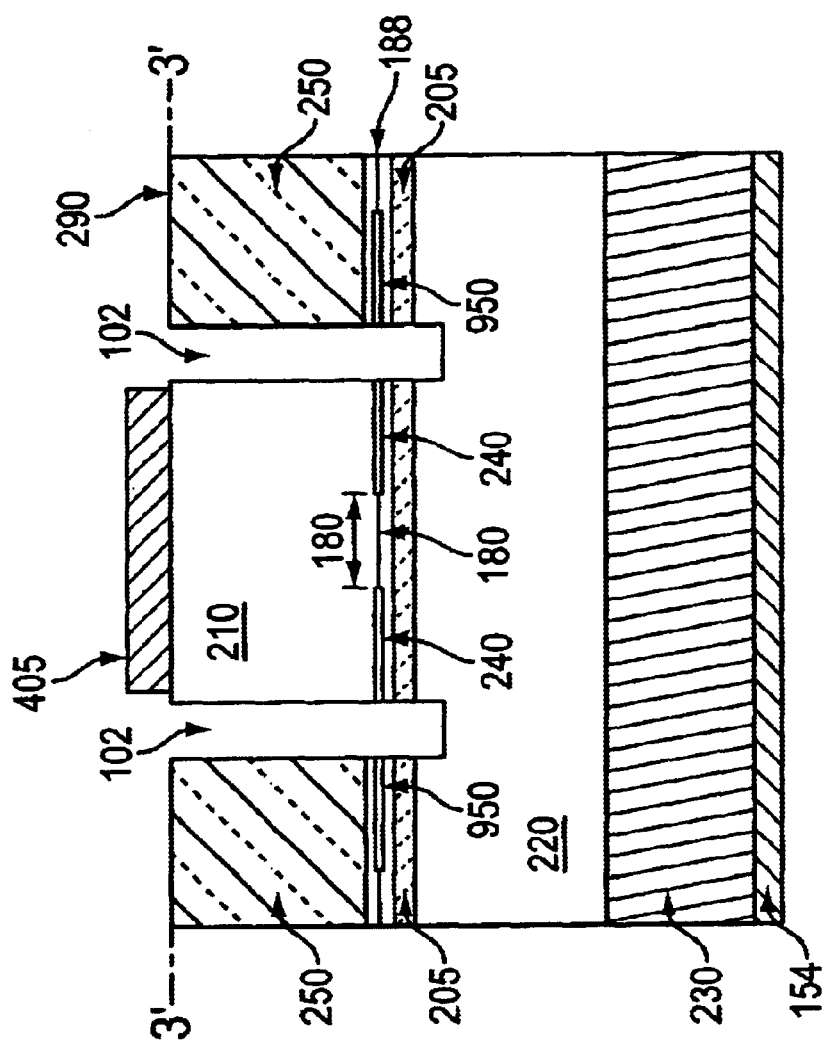
FIG. 6 is sectional view of the vertical cavity surface emitting laser of FIG. 4 through the line 6'—6'.

FIGS. 4–6 illustrate a VCSEL structure configured in accordance with an alternative embodiment in which a transparent top electrode layer 404 is employed. FIG. 4 is a top view of a VCSEL in accordance with an alternative embodiment of the present invention that uses a transparent top electrode layer 404. FIG. 5 is sectional view of the VCSEL of FIG. 4 through the line 5'—5'. FIG. 6 is sectional view of the vertical cavity surface emitting laser of FIG. 4 through the line 6'—6'.

Referring to FIG. 4, the ring portion 105 of FIG. 1 is replaced with a transparent disk portion 405. The transparent disk portion 405 can be made from materials, such as indium-tin-oxide (ITO). The disk shape increases the contact area between the semiconductor and the disk portion 405, thereby reducing the contact resistance.

An additional advantage of this embodiment over the first embodiment is that by increasing the contact area, the isolation depth (e.g., oxidization depth) can be optimized to further reduce the parasitic insulating material capacitance. For this embodiment, it is noted that the entire top electrode 404 can be transparent or only the disk portion 405 can be transparent.

First Mechanism to Reduce Parasitic Oxide Capacitance

One aspect of the present invention is to provide a mechanism to reduce the product of the total parasitic capacitance and the differential resistance at the VCSEL's bias point. The total parasitic capacitance can include, for example, the parasitic insulator capacitance and the parasitic bond pad capacitance. It is noted that the parasitic insulator capacitance depends upon the thickness of the insulator in the insolatable layer. Generally, the thicker the insulator, the less the parasitic insulator capacitance. Unfortunately, as the thickness of the insulator is increased, the resistance due to the funneling of current by the insulator, which is commonly known as the "aperture resistance" also increases, which is not desirable. The following aspects of the present invention are described in the context of an exemplary insulator, oxide. However, it is noted that the principles of the present invention can be extended to any insulator and associated parasitic insulator capacitance.

FIG. 7A illustrates a cross sectional view of a portion of a vertical cavity surface emitting laser having a plurality of capacitance-reducing layers with insulating regions for reducing parasitic oxide capacitance according to one embodiment of the present invention where the capacitance-reducing layers are disposed in both the top and bottom mirror structures. The VCSEL structure 700 includes a first semiconductor mirror stack 220 (e.g., a bottom DBR mirror stack), an active layer 205, and a second semiconductor mirror stack 210 (e.g., a top DBR mirror stack). At least one aperture-defining layer 188 having an isolatable material that is disposed in either the top mirror structure 210 and the bottom mirror structure 220 is provided. In this case, there are two aperture-defining layers 188 where each layer 188 has an insulating region 702 with a first length 703 for defining a current-confining aperture 180. It is noted that the number of aperture-defining layers 188 can be more than two.

The present invention provides a mechanism for reducing the product of the total parasitic capacitance and the differential resistance at the VCSEL's bias point by introducing at least one capacitance-reducing layers 706. In this embodiment, a plurality 704 of capacitance-reducing layers 706 are provided. Each layer 706 has an insulating regions 708 (e.g., oxide rings) with a first dimension (e.g., a length). It is noted that the length of the insulating regions 708 is less than the first length 703 of the current-confining aperture 188. The capacitance-reducing layers 706 can be disposed only into the first semiconductor mirror stack 220, only into the second semiconductor mirror stack 210, or into both the first and second semiconductor mirror stacks 220 and 210.

Preferably, the plurality of insulating regions 708 have differing lengths in order to decrease the parasitic capacitance of the VCSEL while minimally increasing the parasitic resistance thereof.

It is noted that one or more capacitance-reducing layers 706 can be added in the VCSEL structure 700 above and/or below the active layer (or light generation layer) 205. The oxidizable layers in which the insulating regions 708 are to be created can be made with higher aluminum (Al) content layers than the other layers. Consequently, these layers are oxidized much faster than the other layers when exposed to water vapor. The length of each oxide segment can also be selectively adjusted by adjusting the Al content in the layers to arrive at a plurality insulating regions 708 that have tapered lengths. It is well known by those of ordinary skill in the art that the oxidation rate can be adjusted by changing the Al content of the layer.

The spacing between the two neighboring capacitance-reducing layers 706 is preferably below 2000 Å in order to deplete part or all of the free carriers in the semiconductors between the oxidizable layers. Consequently, the semiconductor layer sandwiched by the oxidizable layers is highly resistive, especially when the devices are operated at the gigabit range, and can be viewed as semiconductor capacitors in series with the parasitic oxide capacitor. Since the total capacitance of two or more capacitors in series is less than the individual capacitance of any single capacitor, the total parasitic oxide capacitance of the VCSEL can be reduced by introducing the plurality of oxide regions (e.g., oxide rings which are illustrated in FIGS. 7A and 7B as segments).

This first mechanism can be incorporated into the VCSEL configured in accordance to the first embodiment, illustrated in FIGS. 1–3, or into the VCSEL configured in accordance to the second embodiment, illustrated in FIGS. 4–6, into the VCSEL configured in accordance to a third embodiment, illustrated in FIGS. 9–11, which is described in greater detail hereinafter.

FIG. 7A illustrates a cross sectional view of a portion 700 of a vertical cavity surface emitting laser having a plurality 704 of capacitance-reducing layers 706 with insulating regions 708 for reducing parasitic oxide capacitance according to one embodiment of the present invention where the capacitance-reducing layers 706 are disposed in both the top mirror structure 210 and the bottom mirror structure. Each capacitance-reducing layer 706 has an insulating region 708 with a first lateral dimension, such as a length. It is noted that the lengths of the insulating regions of the layers are preferably different, but may be the same. The plurality 704 of capacitance-reducing layers 706 includes a first set 710 of layers and a second set 720 of layers. The first set 710 of layers is disposed above the light generation layer 205 and a second set of layers is disposed below the light generation layer 205.

The first set 710 of layers has a first layer 714 that is disposed closest to the light generation layer 205. The first layer 714 has an insulating region 718 with a predetermined length 719, and the other layers in the first set 710 have lengths that are equal or decrease as the distance between the layer and the light generation layer 205 increases.

The second set 720 of layers has a first layer 724 that is disposed closest to the light generation layer 205. The first layer 724 has an insulating region 728 with a predetermined length 719, and the other layers in the second set 720 have lengths that are equal or decrease as the distance between the layer and light generation layer 205 increases.

Although the first set 710 and the second set 720 are shown to have an equal number of layers 706 that are evenly spaced apart, it is noted that the number of layers 706 in the first set 710 and the second set 720 need not be equal or be evenly spaced apart. For example, the exact number of layers 706 that exist above the light generation layer 205 and below the light generation layer 205 and the spacing between layers 706 can be adjusted to suit a particular application. Also, although respective layers 706 in the first set 710 and the second set 720 are shown to be symmetric about the light generation layer 205, this need not be the case. For example, the lengths of the insulating regions 708 of respective layers 706 in the first set 710 and the second set 720 can be different and may be adjusted to suit a particular application.

FIG. 7B illustrates a cross sectional view of a portion 760 of a vertical cavity surface emitting laser having a plurality 770 of capacitance-reducing layers 772 with insulating regions 774 for reducing parasitic oxide capacitance according to an alternative embodiment of the present invention where the capacitance-reducing layers 772 are disposed only in the top mirror structure 210. Each capacitance-reducing layer 772 has an insulating region 774 with a first lateral dimension, such as a length. It is noted that the lengths of the insulating regions of the layers are different. The plurality 770 of capacitance-reducing layers 772 includes a first set 780 of layers and a second set 790 of layers. The first set 780 of layers is disposed above an aperture-defining layer 188 and a second set of layers is disposed below the aperture-defining layer 188. The first set 780 of layers has a first layer 784 that is disposed closest to the aperture-defining layer 188. The first layer 784 has an insulating region 774 with a predetermined length 778, and the other layer in the first set 780 has a length that is less than the length of the first layer 784. It is noted that additional capacitance-reducing layers 772 can be utilized in the first set 780. In such a case, the other layers in the first set 780 have lengths that are equal or decrease as the distance between the layer and the aperture-defining layer 188 increases.

The second set 790 of layers has a first layer 794 that is disposed closest to the aperture-defining layer 188. The first layer 794 has an insulating region with a predetermined length 744, and the other layer in the second set 790 has a length that is less than the length of the first layer 794. It is noted that additional capacitance-reducing layers 772 can be utilized in the second set 790. In such a case, the other layers in the second set 790 have lengths that are equal or decrease as the distance between the layer and the aperture-defining layer 188 increases.

Although the plurality of capacitance-reducing layers 770 are shown as disposed only in the top mirror structure 210, it is noted that the plurality of capacitance-reducing layers 770 can be disposed only in the bottom mirror structure 220 or in both the top 210 and bottom 220 mirror structures.

Second Mechanism to Reduce Parasitic Oxide Capacitance

Figure 8A:
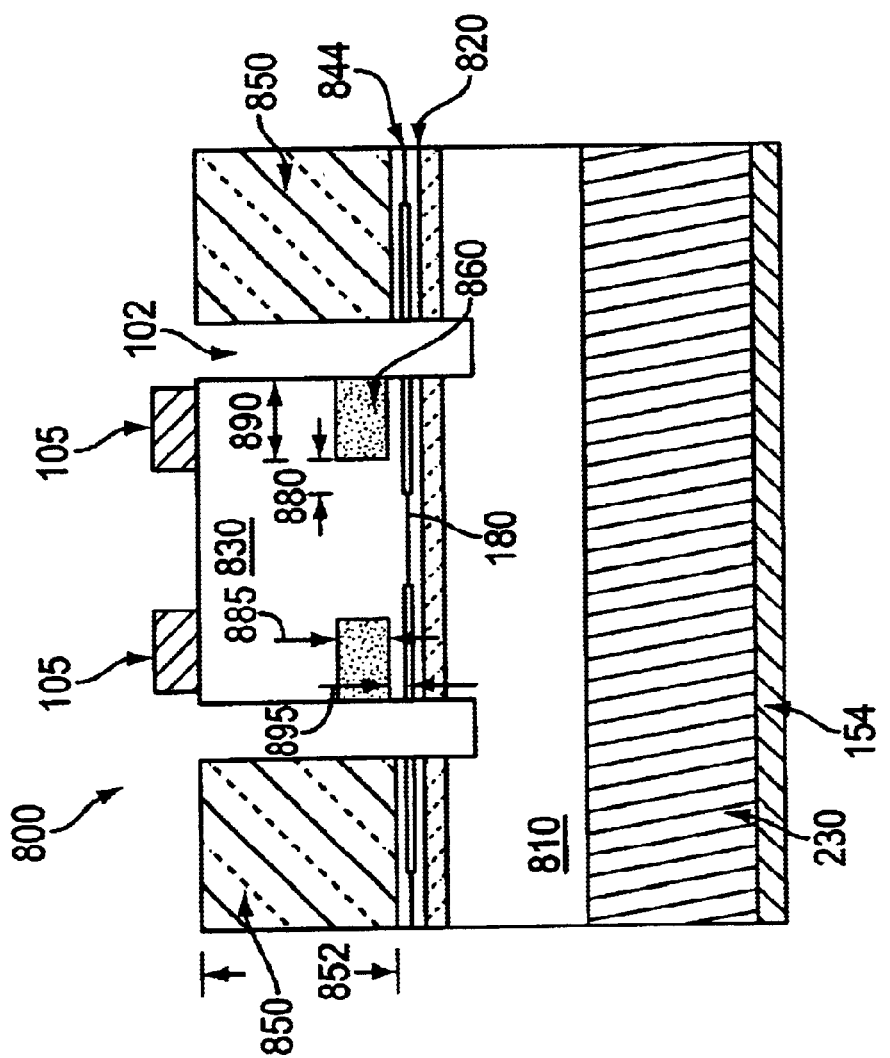
FIG. 8A illustrates a cross sectional view of a portion of a vertical cavity surface emitting laser having a second implantation region for reducing parasitic oxide capacitance according to an one embodiment of the present invention where the second implantation region is utilized in conjunction with the trench aspect of the present invention.
Figure 8B:
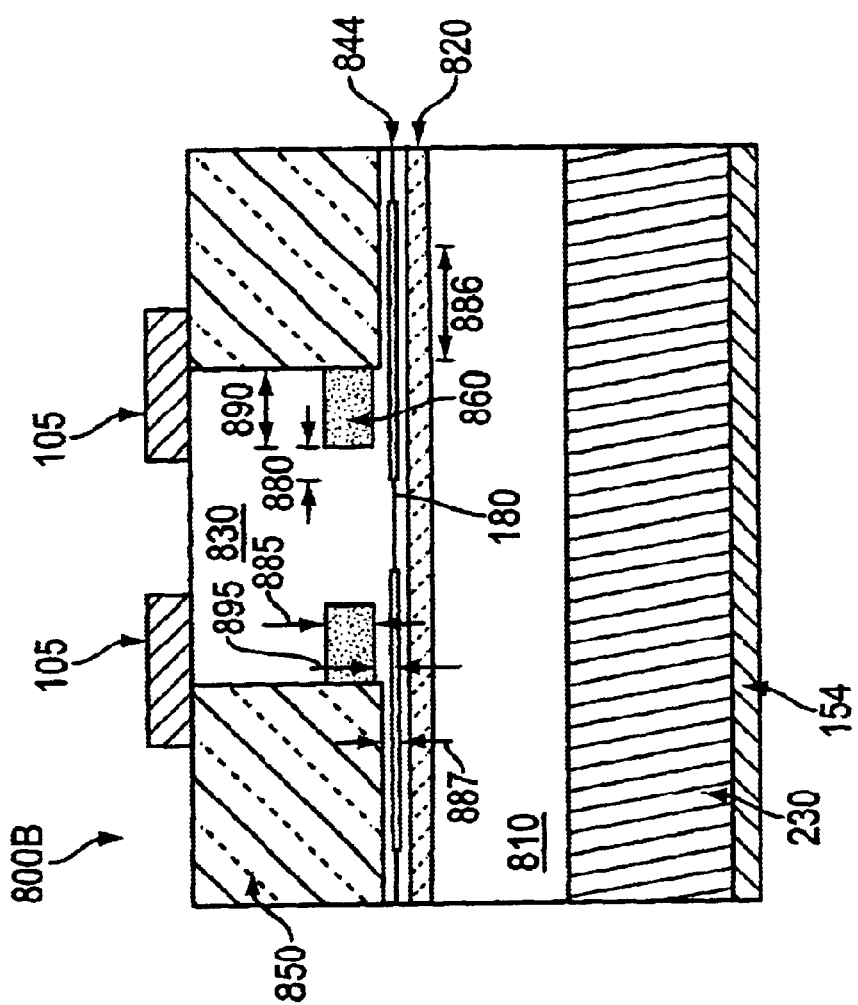
FIG. 8B illustrates a cross sectional view of a portion of a vertical cavity surface emitting laser having a second implantation region for reducing parasitic oxide capacitance according to an alternative embodiment of the present invention where the second implantation region is utilized without the trench aspect of the present invention.

FIGS. 8A and 8B illustrate two embodiments of a second mechanism for reducing the product of the total parasitic capacitance and the differential resistance at the VCSEL's bias point according to an aspect of the present invention. FIG. 8A illustrates a cross sectional view of a portion 800 of a vertical cavity surface emitting laser having a second implantation region for reducing the parasitic capacitance according to an one embodiment of the present invention where the second implantation region is utilized in conjunction with the trench aspect of the present invention. FIG. 8B illustrates a cross sectional view of a portion 800B of a vertical cavity surface emitting laser having a second implantation region for reducing parasitic capacitance according to an alternative embodiment of the present invention where the second implantation region is utilized without the trench aspect of the present invention.

The device structure 800 includes a first semiconductor mirror stack 810 (e.g., a bottom DBR mirror stack), an active layer 820, a second semiconductor mirror stack 830 (e.g., a top DBR mirror stack), and at least one isolatable layer for defining an insulator-confined aperture that is disposed in either the first mirror stack 810, the second mirror stack 830, or if there are a plurality of such isolatable layers, in both the first and second mirror stacks 810 and 830. In this example, the device structure 800 includes a single isolatable layer 844 for defining an insulator-confined aperture 180 that is disposed in the second semiconductor mirror 830.

For planar devices, the structure 800 also has a first implantation region 850 having a first thickness 852. One aspect of the present invention is to provide a capacitance-reducing implantation region 860 having a second thickness 885 that is less than the first thickness 852. For example, the capacitance-reducing implantation region 860 may be relatively thin when compared to the first thickness 852 of the first implantation region 850. Whereas the relatively thick (e.g., 3 microns to 5 microns thick) implantation region 850 is used in the device for the primary purpose of reducing leakage current, the present invention uses a much thinner capacitance-reducing implantation region 860 for reducing the parasitic capacitance of the VCSEL device.

Typically, the edge of the first implant region 850 is disposed so as not to be very close to the edge of the aperture 180 in order to prevent the thick implant profile 850 from significantly increasing the differential resistance of the device. For example, the lateral distance (e.g., the sum of distance 880 and distance 890 of FIG. 8B) from the edge of the first implant region 850 to the edge of the aperture 180 is typically quite large on the order of 10~25 μm. Although this particular spacing addresses the differential resistance of the device, the parasitic capacitance stemming from the aperture-defining layer 844 is unacceptably high for certain high data rate applications. In order to address this problem, the present invention utilizes a second thin implant 860 that is disposed relatively closer to the aperture 180 for reducing the parasitic capacitance without dramatically increasing the resistance.

The capacitance-reducing implantation region 860 is preferably disposed a lateral distance 880, which can be in the range of about 0 to about 5 microns, from the aperture 180. The capacitance-reducing implantation region 860 also has a lateral dimension 890 that is preferably in the range of about 5 microns to about 20 microns or more. It is noted that the lateral dimension 890 can be selectively adjusted to decrease the parasitic capacitance of the device while not substantially increasing the parasitic resistance.

The capacitance-reducing implantation region 860 can be formed only in the first semiconductor mirror 810, only into the second semiconductor mirror 830, or into both the first and second semiconductor mirrors 810 and 830. Preferably, the capacitance-reducing implantation region 860 is fabricated by implanting ions, such as protons, above or below the isolatable layer 844.

It is noted that parameters related to the capacitance-reducing implantation region 860, which can include, but are not limited to, the placement of the capacitance-reducing implantation region 860 with respect to the isolatable layer 844 (e.g., the vertical distance therebetween and/or overlap therebetween), the placement of the capacitance-reducing implantation region 860 with respect to the aperture 180 (e.g., the lateral distance between the edge of the aperture and the edge of the capacitance-reducing implantation region 860), and the thickness 885 of the capacitance-reducing implantation region 860 can be adjusted to suit a particular application provided that the parasitic capacitance of the isolatable layer(s) 844 is greatly reduced while the differential resistance of the device is controlled so that the product of total parasitic capacitance and differential resistance improves after incorporating the capacitance-reducing implantation region 860.

It is further noted that the first implant region 850 can be separated by a distance 887 from the isolatable layer 844. Also, the insulating region of the isolatable layer 844 can extend a distance 886 under the first implantation region 850.

For example, the capacitance-reducing implantation region 860 has a thickness 885 in the range of about 0.2 micron to about 2 micron. Preferably, the thickness 885 of the capacitance-reducing implantation region 860 is preferably less than approximately 3000 Å in order not to unnecessarily increase the electrical resistance through the aperture 180.

The capacitance-reducing implantation region 860 can be disposed separate from the isolatable layer 844 with a distance 895 therebetween or can be disposed in an overlaping fashion with respect to the isolatable layer 844. The capacitance-reducing implantation region 860 is preferably stopped at a distance 895 of about 500 Å to 5000 Å away from the top of isolatable layer 844 in order to minimize any possible implantation damage to the active layer 820. The depth of the capacitance-reducing implantation region 860 is preferably about the same or shorter than the depth of the isolatable layer 844. The capacitance-reducing implantation region 860 can also overlap with the isolatable layer 844 as long as this placement does not raise reliability concerns.

It is noted that by utilizing capacitance-reducing implantation region 860 in accordance with the present invention, at high speed operation (e.g., greater than 1 Gb/s), the physical gap between the isolatable layer 844 and the capacitance-reducing implantation region 860 is highly resistive, and the parasitic capacitance is dominated by the capacitance-reducing implantation region 860 and not by the isolatable layer 844.

This second mechanism to reduce the parasitic capacitance can be incorporated into the VCSEL configured in accordance to the first embodiment, illustrated in FIGS. 1–3, into the VCSEL configured in accordance to the second embodiment, illustrated in FIGS. 4–6, or into the VCSEL configured in accordance to the third embodiment, illustrated in FIGS. 9–11, which is described in greater detail hereinafter.

It is further noted that the second mechanism to reduce the parasitic capacitance is not limited to incorporation into VCSELs having a trench geometry, but instead can be incorporated into other devices that do not have the single trench aspect of the present invention. Referring to FIG. 8B, it is noted that the device does not have a trench. Nevertheless, by using the capacitance-reducing implantation region 860 of the present invention, the product of the total parasitic capacitance and the differential resistance at the VCSEL's bias point parasitic capacitance is reduced.

For example, the capacitance-reducing implantation region 860 can be incorporated into a mesa-type or pillar-type VCSEL designs. A typical etched mesa has a small diameter (e.g., a diameter of about 10~30 $\mu$m) and does not include implantation in the top DBR mirror near by the oxide layer(s). As a result, the parasitic oxide capacitance is controlled by limiting the oxide area, and thus limiting the mesa diameter for a given aperture size. A drawback of the traditional mesa-type or pillar-type VCSEL designs is that the rather narrow contact width leads to a high contact resistance. By incorporating the capacitance-reducing implantation region 860 of the present invention into the mesa structure, the device can maintain a larger mesa diameter in order to obtain a lower differential resistance while reducing or controlling the parasitic oxide capacitance by using the capacitance-reducing implantation region 860.

Mechanism to Reduce the Bond Pad Capacitance

Referring to FIG. 3, the area outside the C-trench loop can be proton implanted deep enough through the active layer to reduce the parasitic capacitance due to the metal pad contact to the semiconductor surface. The present invention can also provide a mechanism for further reducing the parasitic capacitance due to the metal pad contact to the semiconductor surface by introducing a low index dielectric layer (e.g., SiN layer). For example, any low κ dielectric layer can be inserted between the semiconductor surface and the contact metal pad can to further reduce the parasitic capacitance due to the metal pad contact to the semiconductor surface. FIGS. 9–10 and FIG. 11 illustrate this mechanism for reducing contact pad capacitance as applied to the VCSEL structures of the first and second embodiments shown in FIGS. 1–3 and 4–6, respectively.

Figure 9:
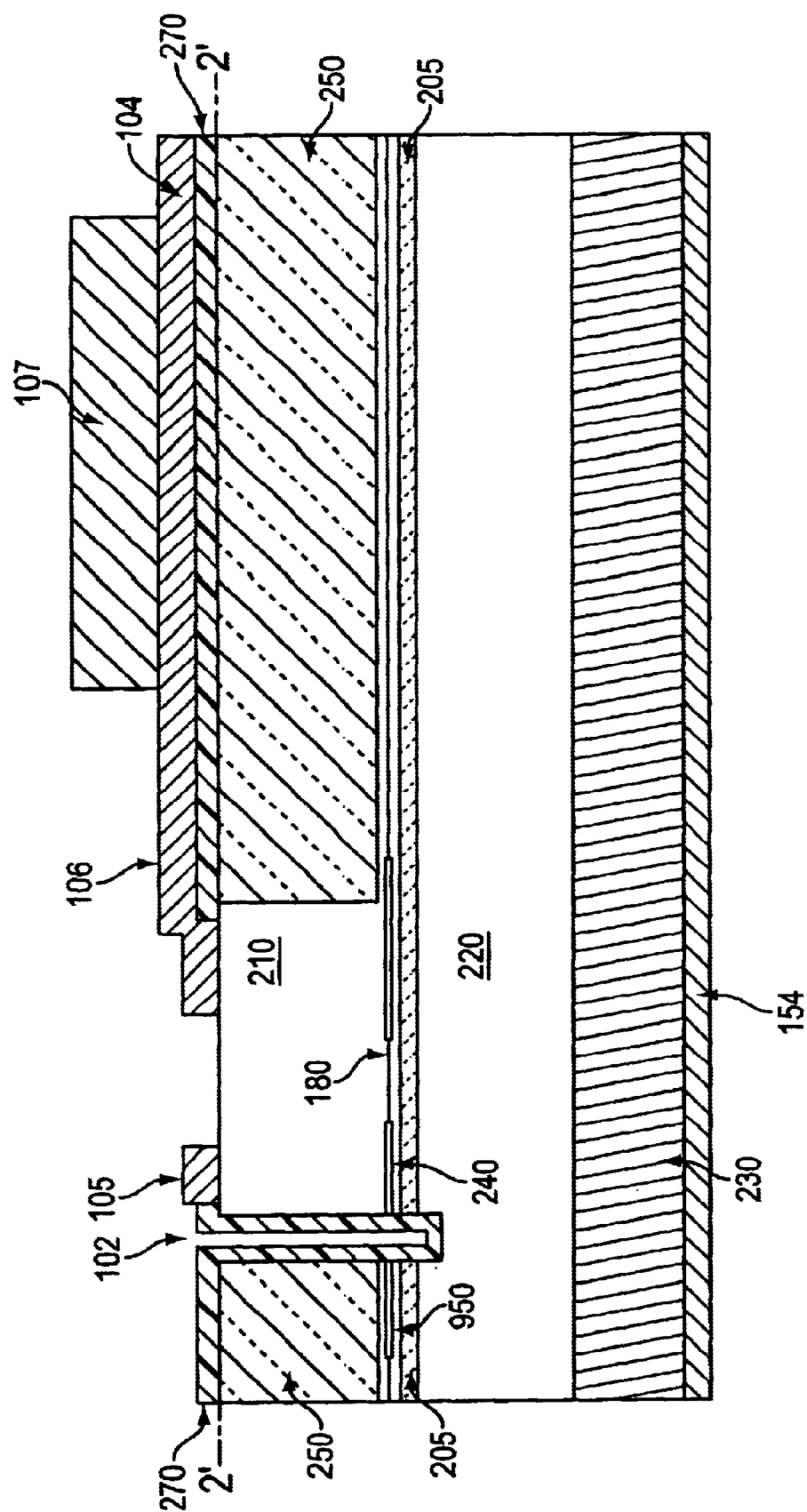
FIG. 9 illustrates a mechanism for reducing the parasitic contact pad capacitance according to an alternative embodiment of the present invention that is incorporated into the VCSEL of FIG. 1.
Figure 10:
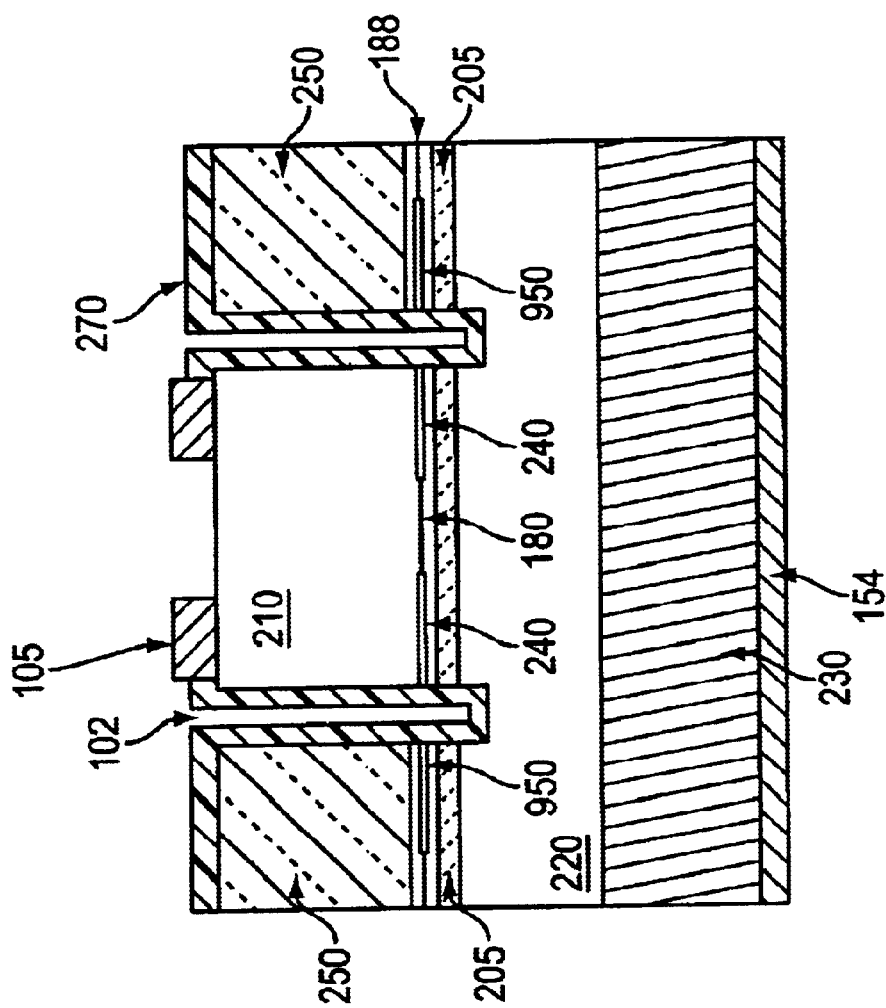
FIG. 10 is sectional view of the vertical cavity surface emitting laser of FIG. 9.

FIG. 9 illustrates a mechanism for reducing the parasitic contact pad capacitance according to an alternative embodiment of the present invention that is incorporated into the VCSEL of FIG. 1. FIG. 10 is another view of the VCSEL of FIG. 9.

It is noted that a low κ dielectric layer 270 is inserted between the semiconductor surface and the contact metal pad to reduce the parasitic capacitance due to the metal pad contact to the semiconductor surface. The low κ dielectric layer 270 can be inserted by using a chemical or physical deposition process and a standard lithography process. The low index dielectric layer 270 can be made from a material that includes, but is not limited to, silicon nitride, nitride, silox, and polymer. In addition to reducing the parasitic capacitance of the VCSEL, the layer 270 also acts as a passivation layer for sealing the trench.

Figure 11:
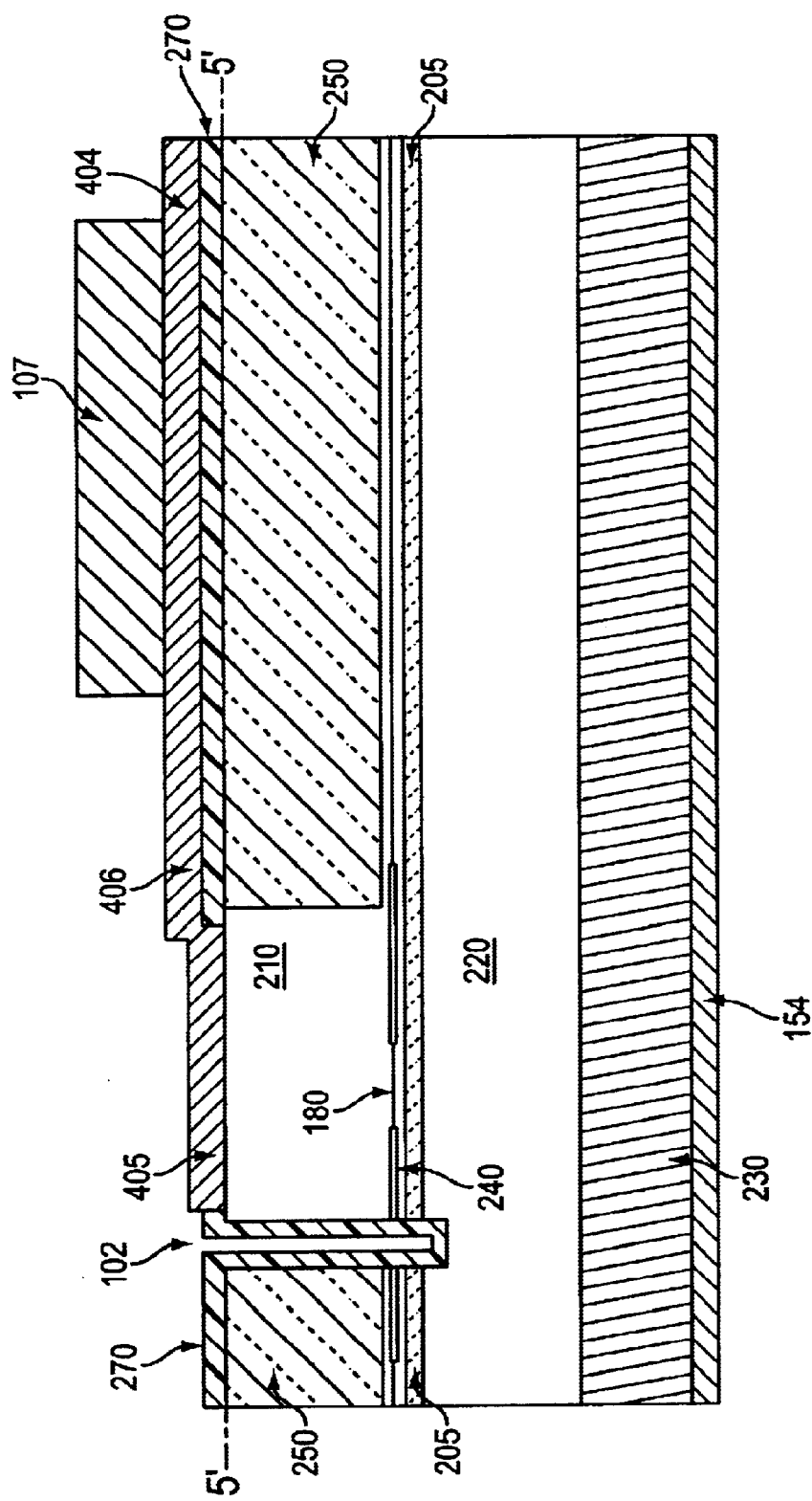
FIG. 11 illustrates a mechanism for reducing the parasitic contact pad capacitance according to another alternative embodiment of the present invention incorporated into the VCSEL of FIG. 4.

FIG. 11 illustrates a mechanism for reducing the parasitic contact pad capacitance according to another alternative embodiment of the present invention incorporated into the VCSEL of FIG. 4. It is noted that a low κ dielectric layer 270 is inserted between the semiconductor surface and the top electrode metal pad 404 to reduce the parasitic capacitance due to the metal pad contact to the semiconductor surface.

Although it is preferred for the semiconductor device to have a near planar top surface in the embodiments having the single continuous trench illustrated in FIGS. 1–6, it is noted that the other mechanisms described to decrease the total parasitic capacitance of the device, such as those mechanism shown in FIGS. 7A, 7B, 8A, 8B, and 9–11, can be implemented independent of a trench and can be applied to semiconductor devices with planar or non-planar top surfaces.

Performance Comparison

Figure 16:
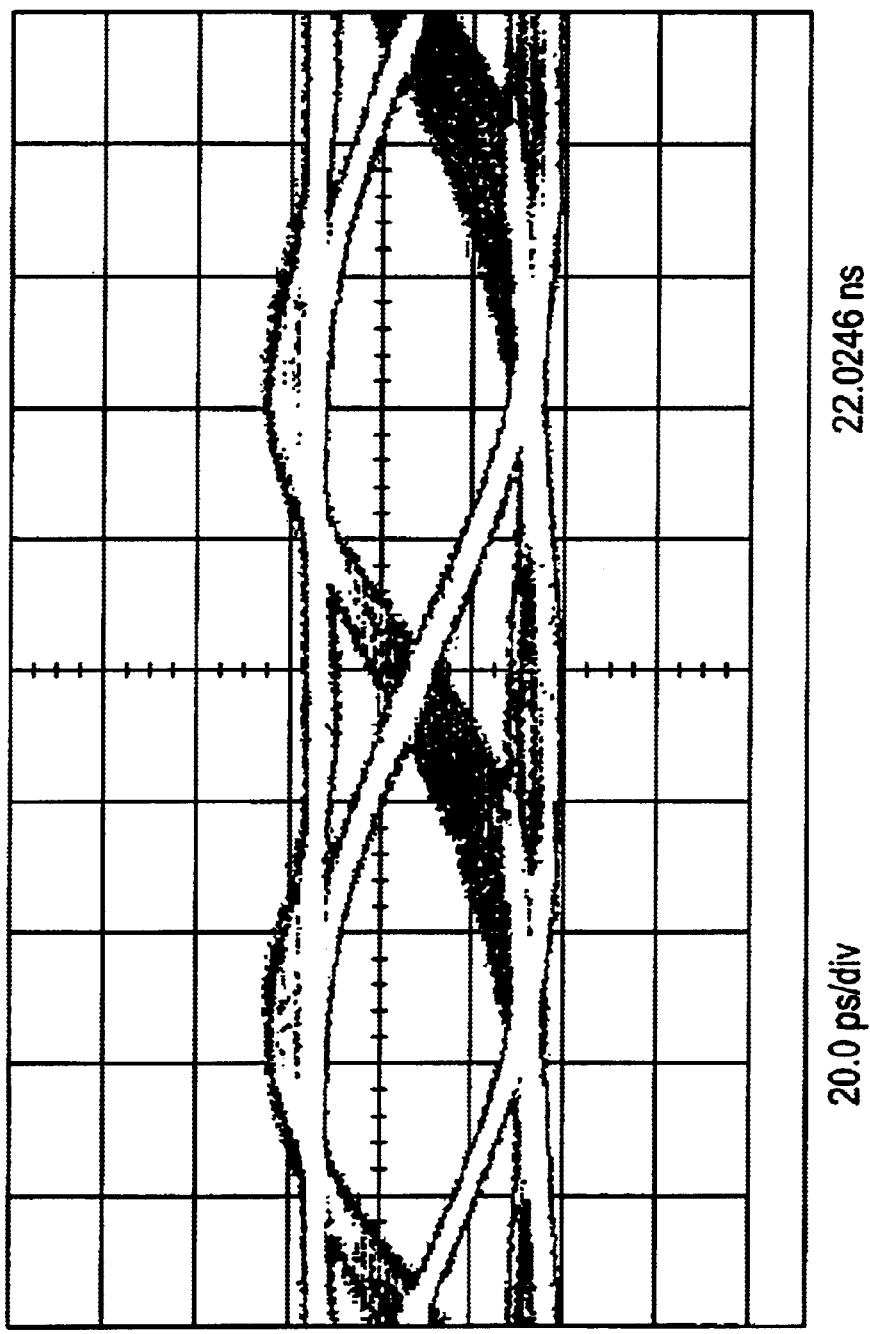
FIG. 16 illustrates a 10 Gb/s data transmission eye diagram achieved from an exemplary planar-type VCSEL structure configured with a single trench with a continuous geometry with an aperture having a closed area as illustrated in FIG. 12A, and two parasitic capacitance reduction mechanisms described in FIGS. 8A–8B and FIGS. 9A–9B, respectively.

It is noted that the total parasitic capacitance of prior art planar-type oxide VCSELs is typically 2–5 pF with a 20%–80% fall-time of 120–240 ps at standard operating power level of 1 to 2 mW with an extinction ratio of 7–10 dB. In contrast, the VCSEL of FIGS. 9 and 10 with a parasitic oxide capacitance reducing trench and a mechanism to reduce the parasitic bond pad capacitance of the present invention has a total parasitic capacitance of less than approximately 0.5 pF with a 20%–80% fall-time of approximately 40–50 ps at standard operating power level of 1 to 2 mW with an extinction ratio of 7–10 dB. Furthermore, as illustrated in FIG. 16, a clear opened eye diagram operated at a data rate of about 10 Gb/s has been achieved by an exemplary embodiment of the VSCEL present invention. Furthermore, improvement in speed performance is feasible if other parasitic reducing mechanisms (e.g., those shown in FIGS. 7 & 8 and described previously) are included into the VCSEL design.

A VCSEL having one or more of the novel structures and mechanism of the present invention can be incorporated into an optical transceiver, such as an optical transceiver that is compliant with IEEE 802.3 z/Gigabit Ethernet. Some exemplary optical data communication applications that can advantageously utilize the VCSEL of the present invention includes switch to switch interface, switched backbone applications, high speed interface for file servers, high performance desktop computers, and single mode and multimode gigabit Ethernet applications.

When multiple VCSELs are constructed by the method of the present invention, additional isolation regions may be included to inhibit electrical and/or optical cross-talk between the VCSELs. Such isolation regions may be introduced by ion implantation or trenches etched between the devices. These techniques are known to those skilled in the art, and hence, are not discussed in detail here. To simplify the drawings, such additional isolation regions have not been shown.

The above-described embodiments of the present invention have a laser aperture defined by oxidizing a portion of a single mirror layer. However, it will be apparent to those skilled in the art from the above discussion that multiple mirror layers may be oxidized to provide laser apertures at various layers.

In the foregoing specification, the invention has been described with reference to specific embodiments being in the form of a vertical-cavity surface emitting laser (VCSEL). It will, however, be evident that various modifications and changes may be made thereto without departing from the broader scope of the invention.

For example, the novel aspects described above can be applied to other oxide confined semiconductor light-emitting devices regardless of the specific material of the semiconductor utilized and the wavelength of the light. As applied to VCSELs, the present invention can be implemented in exemplary structures that can include, but are not limited to, red AlGaInP VCSEL's, 850 nm GaAs VCSEL's, 980 nm InGaAs VCSEL's, InGaAsP-based, InGaAsN-based, and Sb-based VCSEL's. Of course, the wavelength of light can adjusted to be shorter (e.g., in the range of 650 nm) or longer (e.g., in the range of 1500 nm+) than the wavelengths specified above in order to suit a particular application. The specification and drawings are, accordingly, to be regarded in an illustrative rather than a restrictive sense.

Furthermore, various modifications to the present invention will become apparent to those skilled in the art from the foregoing description and accompanying drawings. For example, the teachings of the present invention can be incorporated into other semiconductor light-emitting devices formed from III–IV or II–VI compounds, such as, but not limited to, resonant-cavity surface emitting diodes (RCLEDs). Accordingly, the present invention is to be limited solely by the scope of the following claims.

What is claimed is:

1. A vertical cavity surface emitting laser (VCSEL) comprising:
   a top mirror structure having a surface;
   a light generation region;
   a bottom mirror structure for reflecting light toward said top mirror structure;
   a semiconductor portion having a surface that is disposed substantially planar with respect to the surface of the top mirror structure;
   a layer of isolatable material disposed in at least one of the bottom mirror structure and the top mirror structure, the layer of isolatable material having
      a conducting region;
      an insulating region having an aperture-defining surface for defining the conducting region, an inner portion, and an outer portion; and
      a single trench adjacent to the insulating region for use in generating the insulating region and for isolating the inner portion of the insulating region from the outer portion of the insulating region; wherein the trench has a continuous geometry for reducing the parasitic capacitance of the VCSEL.

2. The vertical cavity surface emitting laser (VCSEL) of claim 1 wherein the insulating region is one of an oxide region and a void region.

3. The vertical cavity surface emitting laser (VCSEL) of claim 1 wherein the aperture-defining surface of the insulating region forms a substantial portion of a perimeter of the conducting region.

4. The vertical cavity surface emitting laser (VCSEL) of claim 1 wherein the aperture-defining surface of the insulating region forms the entire perimeter of the conducting region.

5. The vertical cavity surface emitting laser (VCSEL) of claim 1 further comprising:
   an implantation region having an aperture-defining surface;
   wherein the aperture-defining surface of the insulating region forms a portion of the perimeter of the conducting region; wherein the aperture-defining surface of the implantation region forms a portion of the perimeter of the conducting region; and wherein the portion of the perimeter formed by the implantation region is less than the portion formed by the insulating region.

6. The vertical cavity surface emitting laser (VCSEL) of claim 3 wherein the aperture-defining surface of the insulating region forms at least 75% of the perimeter of the conducting region.

7. The vertical cavity surface emitting laser (VCSEL) of claim 1 wherein the aperture-defining surface of the insulating region forms a generally circular aperture.

8. The vertical cavity surface emitting laser (VCSEL) of claim 1 wherein the continuous geometry of the trench is one of a generally triangular shape, a generally rectangular shape, a generally square shape, a generally circular shape, and a generally elliptical shape.

9. The vertical cavity surface emitting laser (VCSEL) of claim 1 further comprising:
   a top surface;
   an insulating layer having a dielectric constant that is less than the dielectric constant of the adjacent semiconductor and disposed on at least a portion of the top surface;
   a conducting material disposed on at least a portion of the insulating layer for electrically coupling a bond pad to an emitting area;
   wherein the insulating layer reduces the parasitic capacitance of the VCSEL.

10. A vertical cavity surface emitting laser (VCSEL) comprising:
    a top mirror structure;
    a light generation region;
    a bottom mirror structure for reflecting light toward said top mirror structure;
    at least one aperture-defining layer having an isolatable material, the aperture-defining layer disposed in at least one of the top mirror-structure and the bottom mirror structure, the aperture-defining layer having an insulating region with a first length for defining a current-confining aperture; and
    at least one capacitance-reducing layer having an isolatable material, the capacitance-reducing layer having an insulating region with a length that is different from the first length for reducing the product of the total parasitic capacitance and the differential resistance at the VCSEL's bias point.

11. The vertical cavity surface emitting laser (VCSEL) of claim 10 further comprising:
    a plurality of capacitance-reducing layers, each capacitance-reducing layer having an insulating region; and
    wherein adjacent capacitance-reducing layers are separated in a first dimension by less than 2000 Angstroms.

12. The vertical cavity surface emitting laser (VCSEL) of claim 10 wherein the bottom mirror structure and the top mirror structure are distributed Bragg reflector (DBR) mirror structures.

13. The vertical cavity surface emitting laser (VCSEL) of claim 10 wherein the insulating region of the aperture-defining layer has a ring shape geometry and wherein the current-confining aperture has a generally circular geometry.

14. The vertical cavity surface emitting laser (VCSEL) of claim 10 wherein the insulating region of the capacitance-reducing layers has a ring shape geometry.

15. The vertical cavity surface emitting laser (VCSEL) of claim 10 further comprising:
    a plurality of capacitance-reducing layers wherein each capacitance-reducing layer having an insulating region;
    wherein the plurality of capacitance-reducing layers has a first set of layers disposed in the top mirror structure and a second set of layers disposed in the bottom mirror structure, the first set of layers having a first layer disposed closest to the light generation region, the insulating region of the first layer having a predetermined length and the insulating region of the other layers in the first set having lengths that are equal or decrease as the distance between the layer and the light generation region increases,
    the second set of layers has a first layer disposed closest to the light generation region, the insulating region of the first layer having a predetermined length and the insulating region of the other layers in the second set having lengths that are equal or decrease as the distance between the layer and the light generation region increases.

16. The vertical cavity surface emitting laser (VCSEL) of claim 10 further comprising:
    a plurality of capacitance-reducing layers, each capacitance-reducing layer having an insulating region;
    wherein the plurality of capacitance-reducing layers is disposed in at least one of the top mirror structure and the bottom mirror structure, wherein the plurality of capacitance-reducing layers includes a first set of layers and a second set of layers; and
    wherein the first set of layers is disposed above the aperture-defining layer and a second set of layers disposed below the aperture-defining layer, the first set of layers having a first layer disposed closest to the aperture-defining layer, the insulating region of the first layer having a predetermined length and the insulating region of the other layers in the first set having lengths that are equal to or decrease as the distance between the layer and the aperture-defining layer increases,
    the second set of layers having a first layer disposed closest to the aperture-defining layer, the insulating region of the first layer having a predetermined length and the insulating region of the other layers in the second set having lengths that are equal to or decrease as the distance between the layer and the aperture-defining layer increases.

17. The vertical cavity surface emitting laser (VCSEL) of claim 10 further comprising:
    a top surface;
    an insulating layer having a dielectric constant that is less than the dielectric constant of the adjacent semiconductor and disposed on at least a portion of the top surface;
    a conducting material disposed on at least a portion of the insulating layer for electrically coupling a bond pad to an emitting area;
    wherein the insulating layer reduces the parasitic capacitance of the VCSEL.

18. A vertical cavity surface emitting laser (VCSEL) comprising:
    a top mirror structure;
    a light generation region;
    a bottom mirror structure for reflecting light toward said top mirror;
    at least one aperture-defining layer disposed in at least one of the top mirror structure and the bottom mirror structure, the aperture-defining layer having an insulating region for defining a current-confining aperture; and a first implantation region having a first thickness;

a capacitance-reducing implantation region having a second thickness that is less than the first thickness, the capacitance-reducing implantation region formed in at least one of the top mirror structure and the bottom mirror structure and for reducing the product of the total parasitic capacitance and the differential resistance at the VCSEL's bias point.

19. The vertical cavity surface emitting laser (VCSEL) of claim 18 wherein the top mirror structure and the bottom mirror structure are distributed Bragg reflector (DBR) mirror structures.

20. The vertical cavity surface emitting laser (VCSEL) of claim 18 further comprising:

a top surface;

an insulating layer having a dielectric constant that is less than the dielectric constant of the adjacent semiconductor and disposed on at least a portion of the top surface;

a conducting material disposed on at least a portion of the insulating layer for electrically coupling a bond pad to an emitting area;

wherein the insulating layer reduces the parasitic capacitance of the VCSEL.

21. The vertical cavity surface emitting laser (VCSEL) of claim 20 wherein the insulating layer includes a low dielectric constant material; wherein the low dielectric constant material is one of silicon nitride, nitride, silox, and polymer.

22. A vertical cavity surface emitting laser (VCSEL) comprising:

a top mirror structure;

a light generation region;

a bottom mirror structure for reflecting light toward said top mirror;

at least one aperture-defining layer disposed in at least one of the top mirror structure and the bottom mirror structure, the aperture-defining layer having an insulating region for defining a current confining aperture; and a capacitance-reducing implantation region formed in at least one of the top mirror structure and the bottom mirror structure and for reducing the product of the total parasitic capacitance and the differential resistance at the VCSEL's bias point.

* * * * *